United States Patent
Kunishima et al.

(10) Patent No.: US 7,476,611 B2
(45) Date of Patent: Jan. 13, 2009

(54) SEMICONDUCTOR DEVICE AND MANUFACTURING METHOD THEREOF

(75) Inventors: Hiroyuki Kunishima, Kanagawa (JP); Toshiyuki Takewaki, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 259 days.

(21) Appl. No.: 10/980,596

(22) Filed: Nov. 4, 2004

(65) Prior Publication Data

US 2005/0095847 A1   May 5, 2005

Related U.S. Application Data

(62) Division of application No. 10/613,069, filed on Jul. 7, 2003, now Pat. No. 6,949,832.

(30) Foreign Application Priority Data

Jul. 8, 2002   (JP)   ............................. 2002-198432

(51) Int. Cl.
*H01L 21/4763* (2006.01)

(52) U.S. Cl. .................. 438/637; 438/622; 438/625; 438/627; 438/645; 438/687

(58) Field of Classification Search ............... 438/622, 438/625, 627, 637, 643, 645, 687, FOR. 358, 438/FOR. 357

See application file for complete search history.

(56) References Cited

U.S. PATENT DOCUMENTS

| | | | |
|---|---|---|---|
| 5,106,781 A * | 4/1992 | Penning De Vries | ......... 438/645 |
| 5,968,333 A | 10/1999 | Nogami et al. | |
| 5,969,422 A | 10/1999 | Ting et al. | |
| 6,043,153 A | 3/2000 | Nogami et al. | |
| 6,121,141 A | 9/2000 | Woo et al. | |
| 6,232,231 B1 * | 5/2001 | Sethuraman et al. | ......... 438/691 |
| 6,242,349 B1 | 6/2001 | Nogami et al. | |

(Continued)

FOREIGN PATENT DOCUMENTS

JP   61264739 A   * 11/1986

(Continued)

OTHER PUBLICATIONS

Chinese Office Action, dated Jul. 15, 2005, with English translation.

(Continued)

*Primary Examiner*—Andy Huynh
(74) *Attorney, Agent, or Firm*—McGinn IP Law Group, PLLC

(57) ABSTRACT

An interconnect trench is formed on a dielectric layer 12 and a first HSQ layer 14 formed on a semiconductor substrate, and a tantalum family barrier metal layer 24a is formed all over the substrate. Then a seed copper-containing metal layer 60 and a plated copper layer 62 are formed so as to fill a part of the interconnect trench. After that, a bias-sputtered copper-containing metal layer 64 is formed on the plated copper layer 62 so as to fill the remaining portion of the interconnect trench and then heat treatment is performed. As a result, a dissimilar metal contained in the bias-sputtered copper-containing metal layer 64 diffuses uniformly into the plated copper layer 62.

46 Claims, 14 Drawing Sheets

U.S. PATENT DOCUMENTS

| | | | |
|---|---|---|---|
| 6,391,774 B1 * | 5/2002 | Takewaki | 438/687 |
| 6,465,376 B2 | 10/2002 | Uzoh et al. | |
| 2002/0064591 A1 * | 5/2002 | Hongo et al. | 427/96 |
| 2003/0119311 A1 * | 6/2003 | Basol et al. | 438/678 |
| 2004/0052961 A1 * | 3/2004 | Brown et al. | 427/437 |

FOREIGN PATENT DOCUMENTS

| | | | |
|---|---|---|---|
| JP | 04207033 A * | 7/1992 | |
| JP | 11-204524 | 7/1999 | |
| JP | 11204524 A * | 7/1999 | |
| JP | 2000-049229 | 2/2000 | |
| JP | 2000-306996 | 11/2000 | |
| JP | 2000-349085 | 12/2000 | |

OTHER PUBLICATIONS

T. Takewaki, et al., "Formation of gian-grain copper interconnects by a low-energy ion bombardment process for high-speed ULSIs", *Materials Chemistry and Physics* 41 (1995) pp. 182-191.

Japanese Office Action dated May 23, 2006 (with partial English translation).

* cited by examiner

Related Art

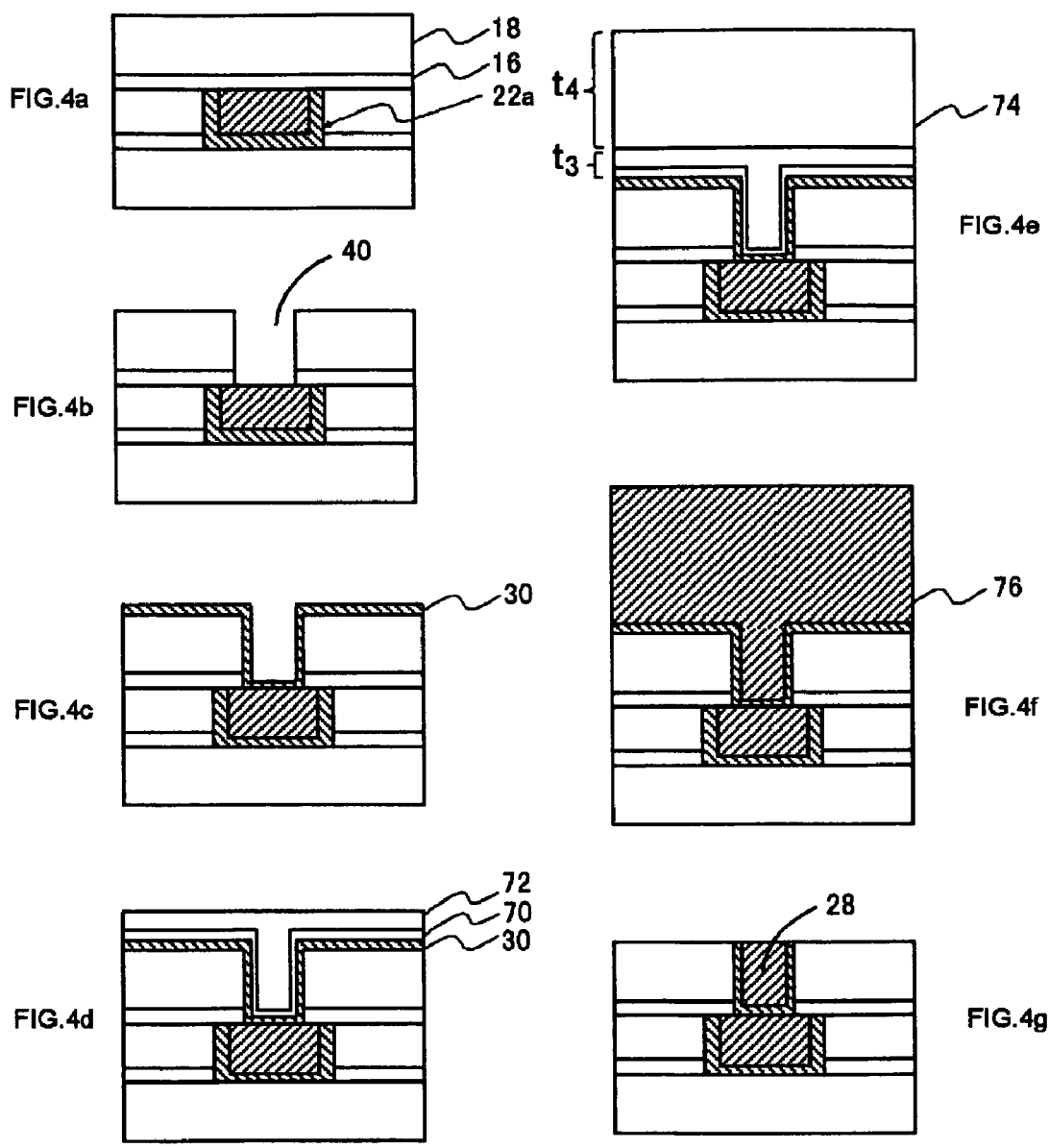

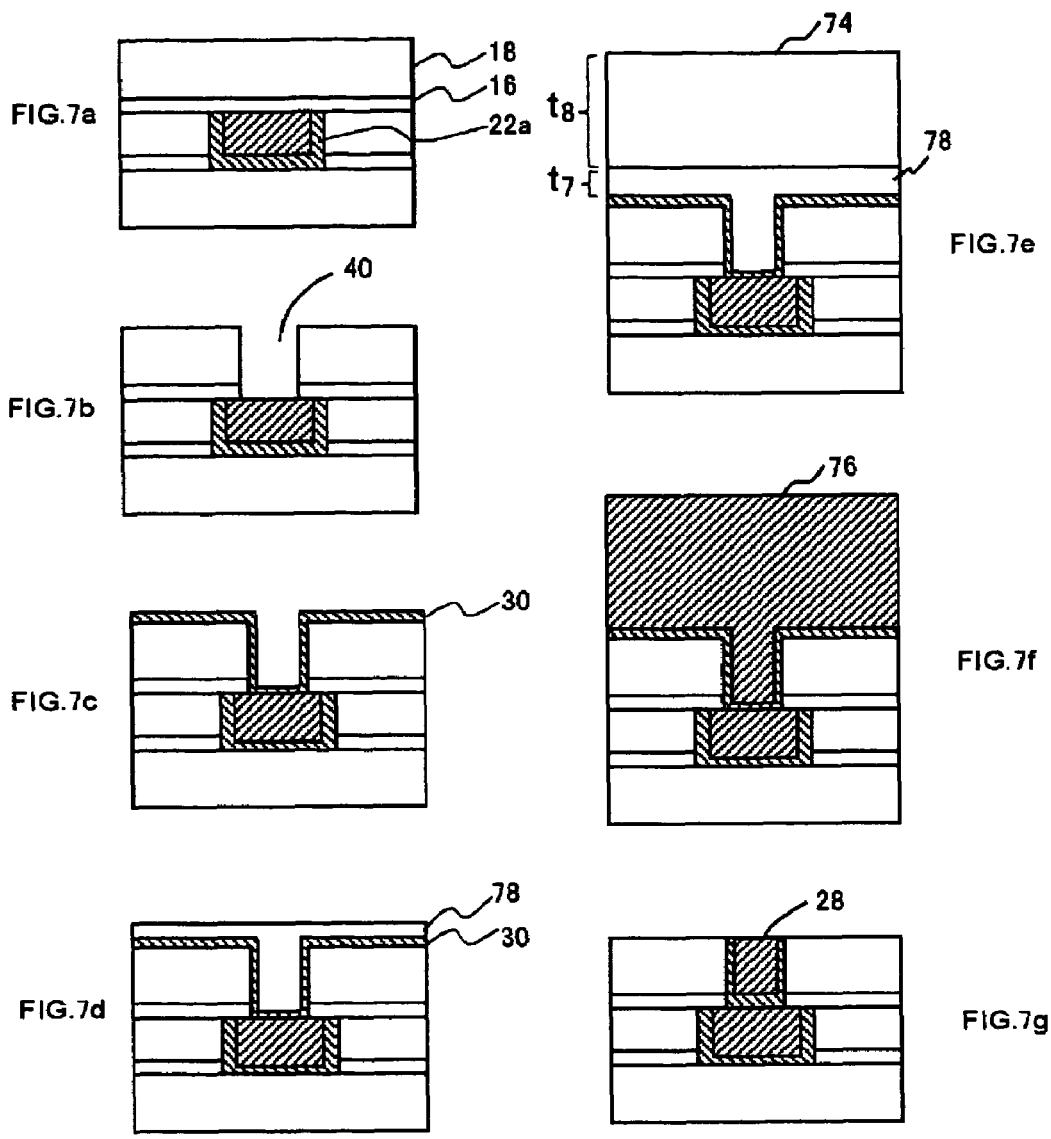

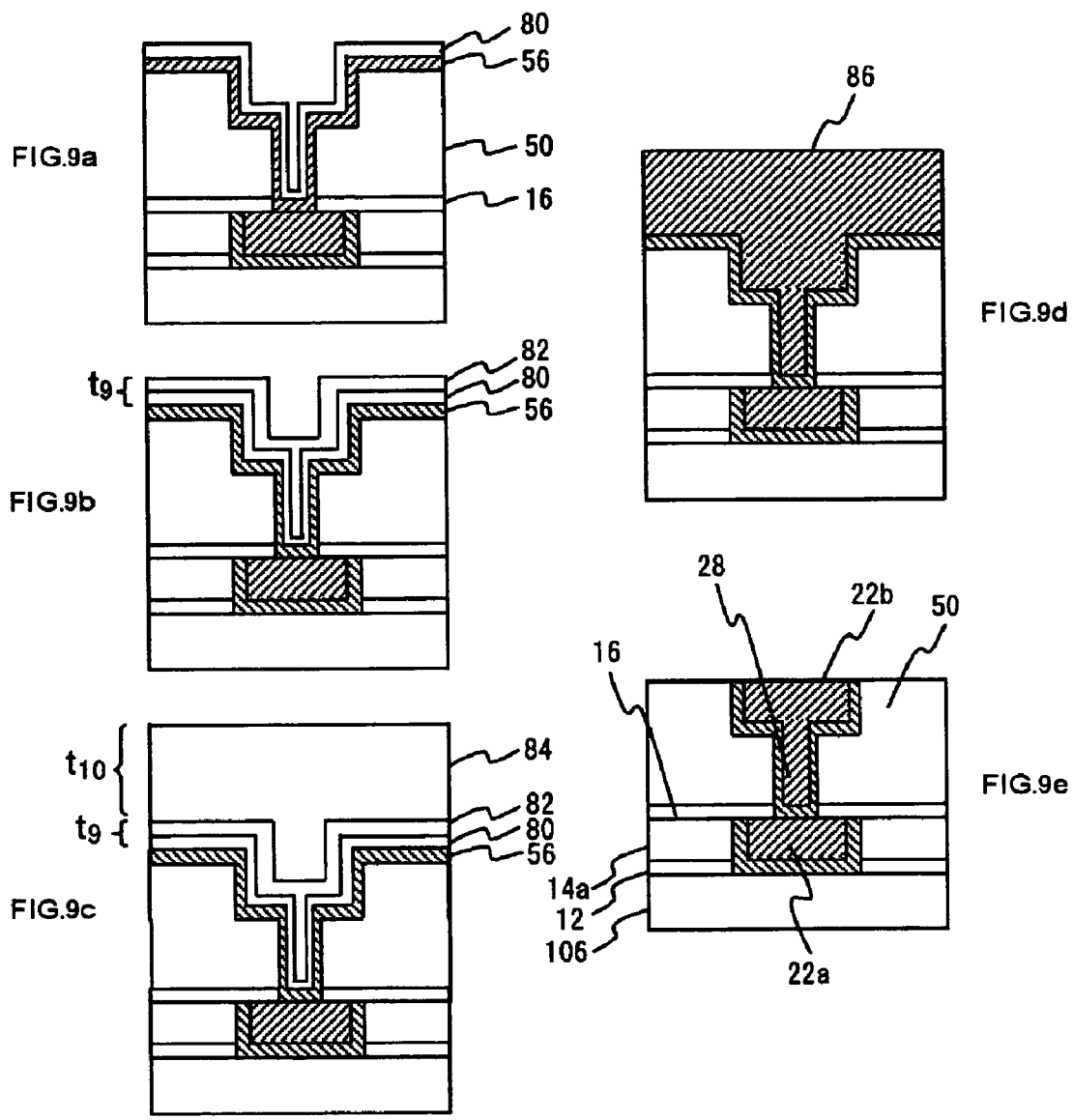

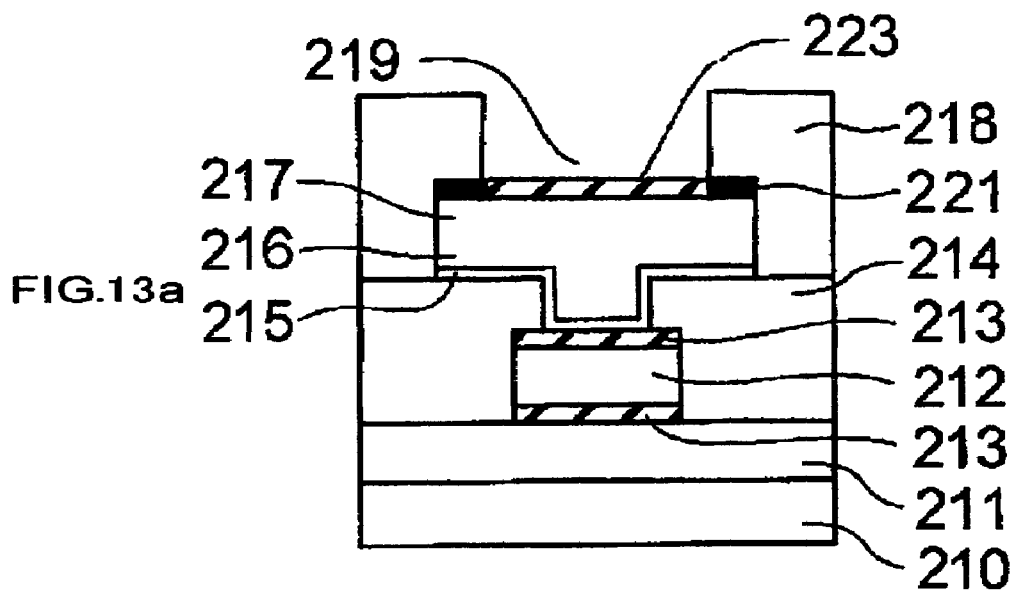
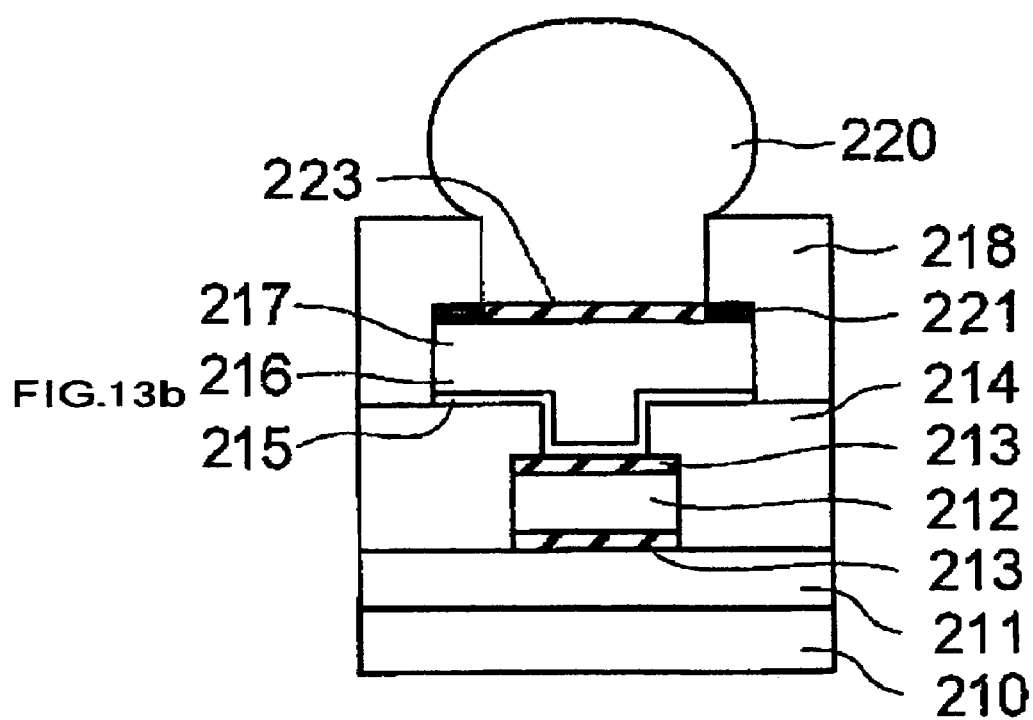

current route

SEMICONDUCTOR DEVICE AND MANUFACTURING METHOD THEREOF

The present Application is a Divisional Application of U.S. patent application Ser. No. 10/613,069 filed on Jul. 7, 2003 now U.S. Pat. No. 6,949,832.

This application is based on Japanese patent application NO.2002-198432, the content of which is incorporated hereinto by reference.

BACKGROUND OF THE INVENTION

1. Field of the Invention

The present invention relates to a semiconductor device and a manufacturing method thereof.

2. Description of the Related Art

In accordance with the recent growing demand for a higher integration level of a semiconductor device, copper has come to be more extensively used as a material for an interconnect, a plug, a pad and so on. Copper has lower electrical resistance and better electromigration resistance than aluminum, which has been conventionally employed.

However, along with a further progress in micronization of elements, electromigration (hereinafter referred to as "EM") has once again become a problem to be eliminated, even with a copper interconnect. A copper layer constituting a copper interconnect, generally formed by plating, consists of a number of combined copper grains of a polycrystalline structure. When a voltage is applied to a copper interconnect having such structure, mass transfer of the copper grains takes place through the grain boundary, resulting in occurrence of EM. In a smaller width interconnect, the problem of EM due to the mass transfer through the grain boundary is more serious since size of a copper grain is also smaller. With an object to solve such problem of EM, various studies are being made focusing on techniques of mixing another metal in a copper interconnect.

For example, the Japanese Laid-Open Patent Application No.11-204524 discloses an interconnect composed of a copper alloy containing silver, niobium or $Al_2O_3$. Specifically, this application provides a method for forming a copper alloy layer wherein a copper alloy layer containing silver is deposited over a bottom of an interconnect trench by sputtering, on which layer a copper layer is deposited by CVD or plating and then heat treatment is performed so that the silver originally contained in the copper alloy diffuses throughout the copper layer. Also, another method is provided wherein after depositing a copper layer by CVD or plating a silver layer is deposited on the copper layer by electrolytic plating, and then heat treatment is performed so that the silver diffuses into the copper layer.

However it is difficult by a conventional method to diffuse a dissimilar metal such as silver throughout an entire interconnect. In order to diffuse a dissimilar metal throughout the entire interconnect it is necessary to raise a temperature or extend a duration time of the heat treatment, while the semiconductor device is prone to be damaged during such intensified heat treatment. Therefore it is difficult to maintain a stable quality level in the semiconductor device production. Also, when depositing a copper alloy layer by sputtering over a bottom of an interconnect trench, since the copper alloy layer cannot be formed in a sufficient thickness in case where a minute interconnect is to be constituted, a sufficient amount of the dissimilar metal for the entire interconnect cannot be provided. On the other hand, when depositing a dissimilar metal by plating, either the dissimilar metal or copper eludes during the plating process because of a deposition potential difference, therefore it is difficult to form a uniform copper alloy layer.

To further complicate the matter, occurrence of stress migration in a copper interconnect has lately become another major problem to be solved. FIG. 1 includes schematic cross-sectional views of a copper multilayer interconnect formed by Damascene method. An upper layer interconnect 121b is connected with a lower layer interconnect 121a, and the upper layer interconnect 121b consists of a connecting plug and an interconnect formed thereon. In such copper multilayer interconnect, a void 122 may appear at the interface of the lower layer interconnect 121a and the plug of the upper layer interconnect 121b owing to stress migration of the copper, resultantly causing disconnection between interconnects which lowers a yield of the semiconductor devices, or by which the semiconductor device becomes unstable after a certain period of use.

In FIG. 1a the void 122 is formed on the side of the upper layer interconnect 121b. In other words, the void is located where the connecting plug constituting the upper layer interconnect 121b is to be. By contrast, in FIG. 1b the void 122 is on an upper surface of the lower layer interconnect 121a. Such a void 122 is considered to be formed because of an internal stress in the copper interconnect caused by heat history etc. during manufacturing process of the semiconductor device. Referring to FIG. 1a, the void 122 is considered to be formed when "suction" of copper is caused in the upper layer interconnect 121b, and the copper migrates upward in the connecting plug. Referring to FIG. 1b, the void 122 is considered to be formed when the cupper migrates in horizontal direction within the lower layer interconnect 121a.

According to studies pursued by the present inventors, it has been proved that such a void is most prone to be formed at a temperature of 150° C. which is the actual processing temperature of a semiconductor device, for example in a bonding process, photoresist baking process, etc. Such a void often causes disconnection between interconnects, and as a result a yield of the semiconductor devices is lowered, or the semiconductor device becomes unstable after a certain period of use. It is critical to increase stress migration resistance at the interface of the interconnect and the connecting plug, i.e. at the surface of the interconnect in order to minimize the formation of such void. However the foregoing conventional technique of depositing a dissimilar metal on a bottom of an interconnect trench is not capable of diffusing the dissimilar metal as far as a surface of the interconnect, and consequently not effective in improving the stress migration resistance.

With an object to restrain an occurrence of the EM and the stress migration, it is essential to study on materials to be employed for constituting a metal region such as interconnect, along with studies on manufacturing process.

In view of the foregoing problems, it is an object of the present invention to increase EM and stress migration resistance of a semiconductor device having a metal region to thereby improve its reliability. Also, it is another object of the invention to provide a manufacturing process by which such semiconductor device can be produced at a stable quality level.

SUMMARY OF THE INVENTION

The present invention provides manufacturing method of a semiconductor device comprising the steps of forming a dielectric layer on a semiconductor substrate; forming a recess or trench on the dielectric layer; forming a first metal layer so as to fill a portion of the recess; forming a second metal layer on the first metal layer so as to fill the remaining portion of the recess; and performing heat treatment of the first metal layer and the second metal layer.

As a result of filling a portion of a recess with a first metal layer and filling the remaining portion of the recess with a second metal layer followed by heat treatment, a metal constituting the second metal layer can diffuse into the first metal layer. Also, by the heat treatment a grain diameter of the first metal layer and the second metal layer is enlarged, because of which a resistance of the metal layers can be reduced and stress migration resistance can be improved. Meanwhile, the invention excludes a combination wherein the first metal layer is a seed layer for plating and the second metal layer is a plating layer.

The first metal layer and the second metal layer can contain copper. Especially, it is preferable that the first metal layer is constituted of a copper-containing metal, i.e. a metal containing copper as its main constituent. Here, the copper-containing metal can be defined as a metal containing, for example, 30% or more than 30% of copper. Also, the copper-containing metal can contain gold, silver, platinum, etc. Further, the copper-containing metal can contain chrome, molybdenum, etc.

The second metal layer can contain a metal that is the main constituent of the first layer and at least one dissimilar element different from such metal.

The second metal layer can comprise a metal that is the main constituent of the first layer and at least one dissimilar element different from such metal. In case where the main constituent metal of the first metal layer is copper, one or not less than two elements can be selected out of Ag, W, Mg, Be, Zn, Pd, Cd, Au, Hg, Pt, Si, Zr, Ti and Sn, as the dissimilar element to be contained in the second metal layer. By performing the heat treatment after forming the first metal layer and the second metal layer, the dissimilar element contained in the second metal layer can uniformly diffuse in the first metal layer, inside the recess. As a result the first metal layer and the second metal layer turn into an alloy, therefore these metal layers are fortified.

Also, since the remaining portion of the recess is filled with the second metal layer, the dissimilar element can uniformly diffuse in the first metal layer despite a lower temperature or a shorter duration time of the heat treatment. Accordingly, even when a material having a low heat resistance is employed for example as an interlayer dielectric film etc., the semiconductor device can be manufactured at a stable quality level. Examples of interlayer dielectric film can include a polyorgano-siloxane such as HSQ (hydrogen-silsesquioxane), MSQ (methyl-silsesquioxane), MHSQ (methyl-hybrido-silsesquioxane), an organic material containing an aromatic family substance such as polyarylether (PAE), divinylsiloxane bis-benzocyclobutene (BCB), Silk (registered trademark), or a low dielectric material such as SOG (spin on glass), FOX (flowable oxide), Parylene, Cytop, BCB (benzocyclobutene). Especially in case where HSQ is employed as the interlayer dielectric film, since HSQ has a similar thermal expansion coefficient to that of copper, reduction of a stress migration of the connecting plug and the interconnect can be further facilitated for this reason.

Also, the term "alloy" herein means a substance made by fusing or coagulating not less than two metal elements, including those containing a non-metal or a semi-metal element other than a metal element. A microstructure status of the alloy can be a solid solution, an intermetallic compound, or a mixture thereof depending on a mixing status of component elements. In other words, a substance containing an additive exceeding its solubility shall also be defined as an "alloy" herein. ("Encyclopedic Dictionary of Chemistry" published by Tokyo Kagaku Dozin Co., Ltd.) Adding Be, Mg, Zn, Pd, Ag, Cd, Au, Pt or Hg as a dissimilar element restrains resistance increase of the copper-containing metal layer. By employing Zr or Ti as a dissimilar element, adherence between, for example, a dielectric layer or barrier metal layer and the metal layer is improved. When a metal having a lower oxidation-reduction potential than copper such as Mg, Sn, Zn, or Cd is utilized as a dissimilar element, corrosion of a surface of the metal layer can be prevented.

An upper limit of content by percentage of a dissimilar element in the second metal layer is not specifically determined, while it is preferable that the content by percentage against the entire metals constituting the second metal layer is not greater; than 5 atomic %, for achieving generally uniform orientation of a surface of the first metal layer and the second metal layer or obtaining a greater grain size by heat treatment.

Now, the first metal layer can be formed by plating or plasma CVD method. The heat treatment can be performed in an atmosphere of an inactive gas such as argon or nitrogen.

The above process can further include removing the first metal layer and the second metal layer formed outside the recess.

In the above process, the recess can be an interconnect trench, and the first metal layer and the second metal layer can constitute an interconnect.

In the heat treatment process, a surface of the first metal layer and that of the second metal layer can be formed in a generally uniform orientation.

In the heat treatment process, the first metal layer and the second metal layer can be formed in an average grain size of not less than 1 μm.

In the heat treatment process, a surface of the first metal layer and that of the second metal layer can be formed in an orientation of (200).

The invention also provides manufacturing method of a semiconductor device comprising the steps of forming a first metal layer on a semiconductor substrate; forming a second metal layer containing a metal that is the main constituent of the first metal layer and a dissimilar element different from such metal over the first metal layer; and forming by heat treatment a dissimilar element-diffused metal layer constituted of the first metal layer and the second metal layer, a surface whereof has a generally uniform orientation.

The term "generally uniform orientation" herein means a state in which at least 90% of the grains are proven to have the same orientation by X-ray analysis. When the orientation is not uniform on a metal layer surface, a void is prone to be produced. For example, in case where the first metal layer is formed by plating, since the orientation of the grains is not uniform such as (111) or (511), different aspects tend to be exposed at a surface of the metal layer, and resultantly a void becomes more likely to appear. By the method according to the invention, since the orientation at a surface of a dissimilar element-diffused metal layer can be made generally uniform and production of a void can be restrained, stress migration resistance of the dissimilar element-diffused metal layer can be improved.

The invention also provides a manufacturing method of a semiconductor device comprising the steps of forming a first metal layer on a substrate; forming over the first metal layer a second metal layer containing a metal that is the main constituent of the first metal layer and a dissimilar element different from such metal; and forming by heat treatment a dissimilar element-diffused metal layer constituted of the first metal layer and the second metal layer, having an average grain size of not less than 1 μm.

Making the average grain size of the dissimilar element-diffused metal layer not less than 1 μm leads to reduction of boundaries between grains at the surface of the dissimilar element-diffused metal layer. Here, the "grain size" is a value obtained by averaging a major axis and a minor axis, and the "average grain size" is a numeric average of the respective grain sizes. This also improves stress migration resistance of the dissimilar element-diffused metal layer.

In the step of forming the dissimilar element-diffused metal layer, the surface of the dissimilar element-diffused metal layer can have an orientation of (200). Here, the "orientation of (200)" means that the grains having the orientation of (200) at the surface of the dissimilar element-diffused metal layer are those of the main constituent thereof. By achieving the orientation of (200), which provides high thermal stability, at the surface of the dissimilar element-diffused metal layer, the orientation of the dissimilar element-diffused metal layer becomes uniform, and resultantly production of a void can be restrained. Consequently, stress migration resistance of the dissimilar element-diffused metal layer can be improved.

The invention provides a manufacturing method of a semiconductor device comprising the steps of forming a dielectric layer on a semiconductor substrate; forming on the dielectric layer a first interconnect trench and a second interconnect trench narrower than the first interconnect trench; forming a first metal layer so as to fill a part of an inner portion of the first interconnect trench and an entire inner portion of the second interconnect trench; and forming a second metal layer over the first metal layer so as to also fill the remaining part of the inner portion of the first interconnect trench. This method can further comprise the step of performing heat treatment of the first metal layer and the second metal layer. Here, the manufacturing method of a semiconductor device can also include a step of forming a plurality of first interconnect trenches and a plurality of second interconnect trenches, in which case a part of an inner portion of the respective first interconnect trenches and an entire inner portion of the respective second interconnect trenches are to be filled with the first metal layer, in the step of forming the first metal layer. Also in the step of forming the second metal layer, the remaining part of the inner portion of the respective first interconnect trenches are to be filled with the second metal layer.

This method simultaneously provides an interconnect formed in the first interconnect trench having a wider groove in which the metal constituting the second metal layer is diffused in the first metal layer, and another interconnect formed in the second interconnect trench having a narrower groove in which the metal constituting the second metal layer is diffused only in a portion of a surface of the first metal layer.

The second metal layer can contain a dissimilar element different from a metal that is the main constituent of the first metal layer. According to this method, an interconnect containing the dissimilar element diffused in its entirety and another interconnect containing the dissimilar element diffused only over an upper portion thereof can be simultaneously formed in the first interconnect trench and the second interconnect trench respectively. As a result, resistance in the finer interconnect, which should be as low as possible, can be kept at a low level and stress migration resistance of a wider interconnect, which is not sufficient in general, can be improved.

In the step of forming the first metal layer, plating method can be employed for forming the first metal layer. The step of forming the first metal layer can include a process to form a seed metal layer by sputtering and a plating process to form a plated metal layer so as to cover the seed metal. In this case, the seed metal layer and the plated metal layer constitute the first metal layer. This process can also include a step of annealing the first plated metal layer. Because of the annealing the grains in the plated metal layer grow, thereby reducing resistance of the plated metal layer.

The step of forming the first metal layer can further comprise the steps of forming on the semiconductor substrate by sputtering a seed metal layer containing a metal that is the main constituent of the first metal layer and a dissimilar element; and forming by plating a plated metal layer containing the metal that is the main constituent of the first metal layer so as to cover the seed metal layer.

According to this method the dissimilar element contained in the seed metal layer can diffuse into the plated metal layer. In case where the second metal layer also contains the dissimilar element, since the dissimilar element diffuses into the plated metal layer from both upper and lower directions, the dissimilar element can diffuse uniformly throughout the first metal layer despite a lower temperature or a shorter duration of time in the heat treatment. Consequently, the semiconductor device can be manufactured at a stable quality level even when a material having a low heat resistance is employed, for example, as an interlayer dielectric film etc.

In the step of forming the second metal layer, sputtering method can be employed for forming the second metal layer. When performing the sputtering method various elements can be employed for forming the second metal layer. Also, density of elements to constitute the second metal layer can be controlled as desired. Further, in case where the second metal layer contains a dissimilar element, forming the second metal layer by sputtering can avoid a problem of elution of a metal due to a deposition potential difference from the metal constituting the first metal layer, and the dissimilar element can diffuse uniformly throughout the first metal layer by the subsequent heat treatment.

The step of forming the second metal layer can also include bias sputtering method for applying a bias to the semiconductor substrate.

The bias sputtering method is a technique to apply either an RF (high frequency) bias or a DC (direct current) bias to the semiconductor substrate. In this process, it is preferable that an ion irradiation energy (plasma potential+self bias) to be applied to the semiconductor substrate is a high bias not less than 80 eV, or more desirably not less than 200 eV. As a result of forming the second metal layer by the bias sputtering method, the orientation of the first metal layer and the second metal layer can be generally uniform and an average grain size of the metal layers can be not less than 1 μm, i.e. 1 μm or more than 1am, by the subsequent heat treatment.

In the step of forming the second metal layer, a film thickness at a plain portion of the second metal layer can be made greater than a thickness at a plain portion of the first metal layer. In addition to constituting an interconnect, a plug or a pad together with the first metal layer after the heat treatment, the second metal layer can also serve to diffuse a dissimilar element into the first metal layer. Also as already described, by forming the second metal layer by bias sputtering in a greater thickness at a plain portion thereof than that of the first metal layer, a dissimilar element-diffused metal layer can be formed in which the orientation at the respective surfaces of the second metal layer and the first metal layer is generally uniform, by the subsequent heat treatment. Consequently in the step of forming the second metal layer, it becomes possible to once form the second metal layer in a greater thickness than is eventually necessary to obtain a dissimilar element-diffused metal layer, and to subsequently remove the dissimilar element-diffused metal layer at an unnecessary portion.

The invention provides a manufacturing method of a semiconductor device comprising the steps of forming a first metal layer on a substrate; forming over the first metal layer a second metal layer containing a metal that is the main constituent of the first metal layer and a dissimilar element different from such metal; performing heat treatment of the first metal layer and the second metal layer for forming a dissimilar element-diffused metal layer constituted of the first metal layer and the second metal layer; and removing an upper portion of the dissimilar element-diffused metal layer.

The second metal layer can be constituted of an alloy containing a metal that is the main constituent of the first metal layer and a dissimilar element. By the heat treatment following the formation of the first metal layer and the second metal layer, the dissimilar element contained in the second metal layer can diffuse uniformly throughout the first metal layer, so that the dissimilar element-diffused metal layer becomes an alloy. As a result, strength of the dissimilar element-diffused metal layer is increased.

In the removing step in this manufacturing method, the dissimilar element-diffused metal layer can be removed in a greater thickness than a thickness at a plain portion of the second metal layer defined at the step of forming the second metal layer.

The first metal layer can mainly contain copper. The dissimilar element-diffused metal layer can constitute an interconnect, a plug or a pad. The void 122 shown in FIG. 1b is prone to be produced in case where a connecting plug is formed in the proximity of a boundary of grains in the lower layer interconnect 121a, while the void is not likely to appear when the connecting plug is formed at a sufficiently distant position from the boundary. Also, when the connecting plug is located close to the boundary, the void tends to appear at the boundary rather than right under the connecting plug. It is also proven that a void is especially prone to be formed at a position where a plurality of boundaries of a plurality of grains is overlapping. Accordingly, when the method of the invention is applied to an interconnect, formation of a void as shown in FIG. 1b can be restrained and the stress migration resistance of the interconnect can be improved. Also, the connecting plug or pad becomes susceptible to stress migration in case where a number of grain boundaries is located on its surface. Consequently, by applying the method of the invention to the connecting plug or pad, the stress migration resistance thereof can be improved.

The invention provides a semiconductor device comprising a semiconductor substrate; and a dissimilar element-diffused metal layer formed on the semiconductor substrate, containing copper and a dissimilar element other than copper and having a generally uniform orientation at a surface thereof.

Since such semiconductor device has a generally uniform orientation at a surface of the dissimilar element-diffused metal layer, formation of a void can be restrained, and consequently the stress migration resistance of the dissimilar element-diffused metal layer can be improved.

The invention also provides a semiconductor device comprising a semiconductor substrate; and a dissimilar element-diffused metal layer formed on the semiconductor substrate, containing copper and a dissimilar element other than copper, constituted of grains of an average size not less than 1 µm.

Since this semiconductor device has a reduced number of boundaries between grains at a surface of the dissimilar element-diffused metal layer, the stress migration resistance of the dissimilar element-diffused metal layer is improved.

In the above semiconductor device, an average grain size of crystals of the dissimilar element-diffused metal layer can be made greater than an average thickness of the dissimilar element-diffused metal layer.

Since an average grain size of crystals of the dissimilar element-diffused metal layer is greater than an average thickness of the dissimilar element-diffused metal layer in the above semiconductor device, resistance of the dissimilar element-diffused metal layer can be reduced. Also, since a number of the boundaries between grains at a surface of the dissimilar element-diffused metal layer can be reduced, the stress migration resistance of the dissimilar element-diffused metal layer can be improved.

In the above semiconductor device, a surface of the dissimilar element-diffused metal layer can have an orientation of (200). By achieving the orientation of (200), which provides high thermal stability, at the surface of the dissimilar element-diffused metal layer, the orientation of the dissimilar element-diffused metal layer becomes uniform, and resultantly production of a void can be restrained. Consequently, stress migration resistance of the dissimilar element-diffused metal layer can be improved.

In the above semiconductor device, the dissimilar element-diffused metal layer can constitute an interconnect having a width not less than 1 µm.

In case of a relatively wide interconnect which is 1 µm or more in width, since the grain size is smaller with respect to the interconnect width and so there is a number of grain boundaries on a metal layer constituting the interconnect, stress migration is prone to take place. In the semiconductor device according to the invention, since the grain size can be larger a number of the boundaries between grains at a surface of the dissimilar element-diffused metal layer can be reduced, and resultantly the stress migration resistance of the dissimilar element-diffused metal layer can be improved.

In this semiconductor device, the dissimilar element-diffused metal layer can constitute an interconnect, a plug or a pad. In this semiconductor device, the dissimilar element-diffused metal layer can be formed by plating.

The invention provides a semiconductor device comprising a semiconductor substrate; a first interconnect formed on the semiconductor substrate; and a second interconnect constituted of a metal that is the main constituent of the first interconnect, disposed in the identical interconnect layer; wherein the second interconnect is narrower than the first interconnect; and the first interconnect and the second interconnect have different orientations at the respective surfaces thereof.

In such semiconductor device, a width of the second interconnect can be made narrower than that of the first interconnect, and a surface of the first interconnect can have a principal orientation of (200), and the second interconnect can have that of (111). The "principal orientation" herein means the orientation of a main constituent. A width of the first interconnect can be made for example not less than 1 µm, and that of the second interconnect not more than 1 µm.

The invention provides a semiconductor device comprising a semiconductor substrate; a first interconnect formed on the semiconductor substrate; and a second interconnect constituted of a metal that is the main constituent of the first interconnect, formed in the identical interconnect layer; wherein the second interconnect is narrower than the first interconnect; the first interconnect contains a dissimilar element other than a main constituent of the first interconnect diffused throughout the first interconnect; and the second interconnect contains a dissimilar element formed over an upper surface thereof.

The invention provides a metal interconnect constituted of a plated metal layer containing a plurality of dissimilar elements, wherein an average size of grains contained in the plated metal layer is not less than 1 μm. The metal interconnect can have a width not less than 1 μm.

The invention provides a metal interconnect constituted of a plated metal layer containing a plurality of dissimilar elements, wherein the plated metal layer is constituted of a single grain. The metal interconnect can have a width not less than 1 μm.

With reference to the foregoing constitutions of the invention, it is possible to make various alterations in actual applications. For example, in case of applying the invention to an interconnect to be formed by Damascene method, the effect of the invention becomes more apparent. Similar examples shall be described hereunder.

The first metal layer, the second metal layer and the dissimilar element-diffused metal layer can be formed either by single Damascene method or dual Damascene method.

The single Damascene method includes the following steps.
(a) forming on a semiconductor substrate a first interconnect constituted of a metal layer;
(b) forming a first interlayer dielectric film all over an upper surface of the semiconductor substrate so as to cover the first interconnect;
(c) selectively removing the first interlayer dielectric film for forming a connecting hole that reaches an upper surface of the first interconnect;
(d) forming a barrier metal layer so as to cover an inner surface of the connecting hole, followed by forming a metal layer to fill the connecting hole;
(e) removing the metal layer located outside the connecting hole for forming a connecting plug;
(f) forming a second interlayer dielectric film all over the upper surface of the semiconductor substrate so as to cover the connecting plug;
(g) selectively removing the second interlayer dielectric film for forming an interconnect trench, so that the connecting plug is exposed at a bottom of the interconnect trench;
(h) forming a barrier metal layer so as to cover an inner surface of the interconnect trench, followed by forming a metal layer to fill the interconnect trench; and
(i) removing the metal layer located outside the interconnect trench for forming a second interconnect trench.

To the foregoing process, the semiconductor device and the manufacturing method thereof according to the invention can be applied considering a part or the whole of the metal layer to be the "first metal layer", the "second metal layer" or the "dissimilar element-diffused metal layer". Furthermore, a part of the above steps (a) to (i) can be omitted as the case may be.

The dual Damascene method includes the following steps.
(a) forming on a semiconductor substrate a first interconnect constituted of a metal layer;
(b) forming a first interlayer dielectric film all over an upper surface of the semiconductor substrate so as to cover the first interconnect;
(c) selectively removing the first interlayer dielectric film for forming a connecting hole that reaches an upper surface of the first interconnect and an interconnect trench that reaches an upper portion of the connecting hole;
(d) forming a barrier metal layer so as to cover an inner surface of the connecting hole and the interconnect trench, followed by forming a metal layer to fill the connecting hole and the interconnect trench; and
(e) removing the metal layer located outside the interconnect trench for forming a second interconnect.

To the foregoing process, the semiconductor device and the manufacturing method thereof according to the invention can be applied considering a part or the whole of the metal layer to be the "first metal layer", the "second metal layer" or the "dissimilar element-diffused metal layer". In this case, a part of the above steps (a) to (e) can be omitted as the case may be.

The foregoing single or dual Damascene method can further include a step of forming a diffusion barrier constituted of SiC, SiCN, SiN, SiOF, SiOC or SiON over the first interconnect, prior to the step of forming the first interlayer dielectric film, so that the first interlayer dielectric film and the diffusion barrier are selectively removed in the step of forming the connecting hole. In this way, forming an diffusion barrier utilizing a low dielectric constant material improves a characteristic of the semiconductor device.

In the foregoing single or dual Damascene method, the barrier metal layer can for example contain a refractory metal such as Ti, W, Ta, etc. Examples of a preferable barrier metal layer include, for example, Ti, TiN, W, WN, Ta, TaN, etc. Especially, a tantalum family barrier metal having TaN and Ta layers is preferably employed. The barrier metal layer can be formed by sputtering, CVD, etc.

An interconnect structure formed by the foregoing Damascene method comprises a semiconductor substrate; a first interconnect formed on the semiconductor substrate; a connecting plug connected with the first interconnect; and a second interconnect connected with the connecting plug.

To such semiconductor device, the invention can be applied considering a part or the whole of the first and the second interconnect and the connecting plug to be the "first metal layer", the "second metal layer" or the "dissimilar element-diffused metal layer".

Also, the invention can be applied to an inspection electrode pad, to be provided on a semiconductor device comprising a semiconductor substrate; an interconnect layer formed on the semiconductor substrate; and an inspection electrode pad disposed on the interconnect layer. To such semiconductor device, the invention can be applied considering a part or the whole of the interconnect layer and the electrode pad to be the "first metal layer", the "second metal layer" or the "dissimilar element-diffused metal layer".

The invention provides a semiconductor device comprising a semiconductor substrate; and a copper-containing metal layer formed on the semiconductor substrate, having a generally uniform orientation at its surface.

The invention provides a semiconductor device comprising a semiconductor substrate; and a copper-containing metal layer formed on the semiconductor substrate, having an average grain size not less than 1 μm.

Since such semiconductor device has a reduced number of boundaries between grains at a surface of the copper-containing metal layer, the stress migration resistance of the copper-containing metal layer can be improved.

The invention provides a semiconductor device comprising a semiconductor substrate; and a copper-containing metal layer formed on the semiconductor substrate; wherein an average grain size of crystals of the copper-containing metal layer is greater than an average thickness of the copper-containing metal layer.

Since an average grain size of crystals of the copper-containing metal layer is greater than an average thickness of the copper-containing metal layer in the above semiconductor device, resistance of the copper-containing metal layer can be reduced. Also, since a number of the boundaries between grains at a surface of the copper-containing metal layer can be reduced, the stress migration resistance of the dissimilar element-diffused metal layer can be improved.

In such semiconductor device, a surface of the copper-containing metal layer may have an orientation of (200).

In such semiconductor device, the copper-containing metal layer may constitute an interconnect, having a width not less than 1 µm.

Referring to a conventional copper interconnect that is relatively wide such as 1 µm or more, since the grain size is smaller with respect to the interconnect width and so there is a number of grain boundaries on a copper layer, stress migration is prone to take place. In the above semiconductor device, since the grain size can be larger a number of the boundaries between grains at a surface of the copper layer can be reduced, and resultantly the stress migration resistance of the interconnect can be improved.

In the above semiconductor device, the copper-containing metal layer can constitute an interconnect, a plug or a pad.

The invention provides a metal interconnect constituted of a copper-containing plated layer, wherein an average size of grains contained in the copper-containing plated layer is not less than 1 µm. The metal interconnect can have a width not less than 1 µm.

The invention provides a metal interconnect constituted of a copper-containing plated layer, wherein the copper-containing plated layer is constituted of a single grain. The metal interconnect can have a width not less than 1 µm.

It is to be noted that any arbitrary combination of the above-described structural components and expressions changed between a method, an apparatus, a system and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

FIGS. 4a, 4b, 4c, 4d, 4e, 4f and 4g are schematic cross-sectional views showing a manufacturing process of the interconnect structure of FIG. 2;

FIGS. 7a, 7b, 7c, 7d, 7e, 7f, and 7g are schematic cross-sectional views showing a manufacturing process of an interconnect structure according to the second embodiment;

FIGS. 9a, 9b, 9c, 9d, and 9e are schematic cross-sectional views showing a manufacturing process of an interconnect structure according to the third embodiment;

FIGS. 13a and 13b are schematic cross-sectional views showing a manufacturing process of an electrode pad according to the sixth embodiment.

PREFFERD EMBODIMENT OF THE PRESENT INVENTION

The invention will now be described based on preferred embodiments which do not intend to limit the scope of the present invention but exemplify the invention. All of the features and the combinations thereof described in the embodiment are not necessarily essential to the invention.

Figure 1A:
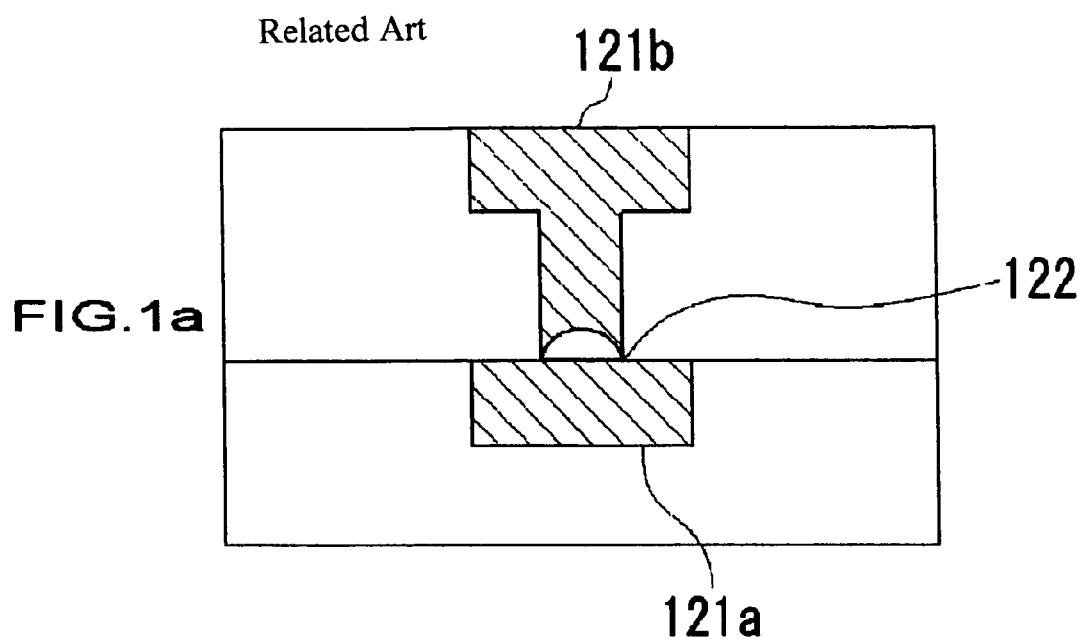
FIGS. 1a and 1b show schematic cross-sectional views of a copper multilayer interconnect formed by Damascene method.
Figure 1B:
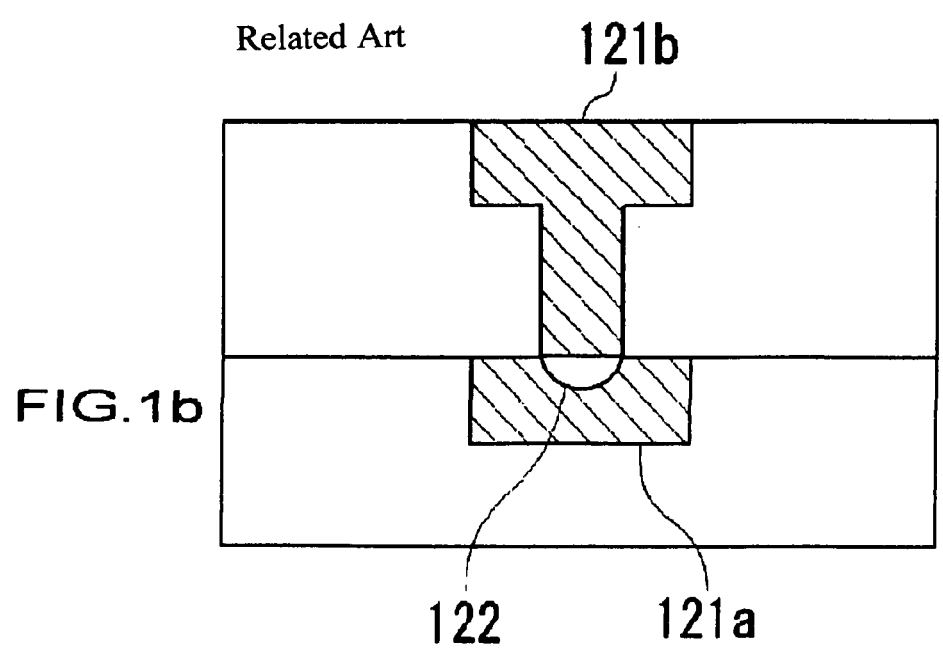
Figure 2:
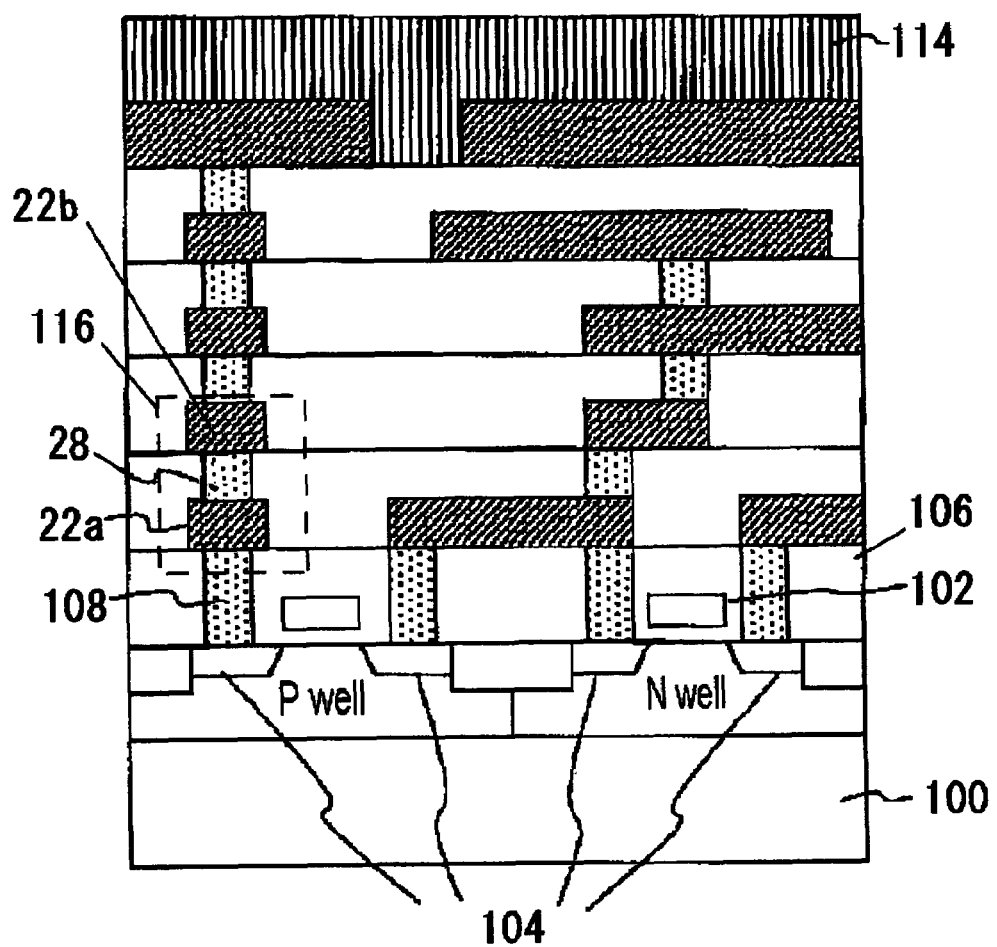
FIG. 2 is a schematic cross-sectional view showing a semi-conductor device according to the present invention.

FIG. 2 is a schematic cross-sectional view showing a semi-conductor device according to the present invention. On a silicon substrate 100, a MOS transistor provided with a gate electrode 102, a diffusion layer 104, etc. is located. A dielectric layer 106 is provided so as to embed the MOS transistor. A connecting plug 108 connected with the diffusion layer 104 is provided in the dielectric layer 106, and on the connecting plug 108 a first copper-containing metal interconnect 22a, a connecting plug 28 and a second copper-containing metal interconnect 22b are disposed in this order. Over these layers including the copper interconnects, copper interconnect layers of a similar constitution are layered, with a passivation layer 114 provided at an uppermost level. Also, the copper-containing metal interconnect 22a is electrically connected with elements disposed on the silicon substrate 100. Further, the first copper-containing metal interconnect 22a, the connecting plug 28 and the second copper-containing metal interconnect 22b referred to in the subsequent description can be construed as any of those shown in different layers in FIG. 2. Now referring to a portion enclosed in a dot line 116 in FIG. 2 as an example, the embodiment of the invention shall be described hereunder.

First Embodiment

The first embodiment shall be described referring to FIGS. 3a to 5, with respect to an interconnect formed by single Damascene method, in which the present invention is incorporated.

Figure 3A:
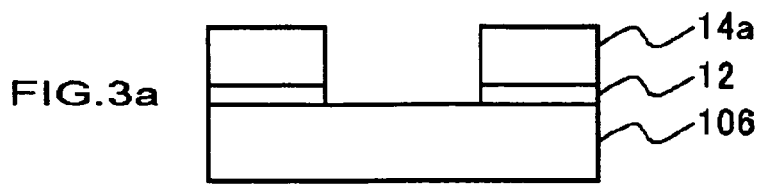
FIGS. 3a, 3b, 3c, 3d, 3d, 3e, and 3f are schematic cross-sectional views showing a manufacturing process of the interconnect structure of FIG. 2.

To start with, on the dielectric layer 106 formed on a silicon substrate (not shown), a first SICN layer 12 (thickness approx. 70 nm) and a first HSQ layer 14a (thickness approx. 700 nm) are formed, on which a resist layer (not shown) patterned in a prescribed design is then provided, and progressive etching is performed on the first SICN layer 12 and the first HSQ layer 14a to form an interconnect trench (FIG. 3a).

Figure 3B:
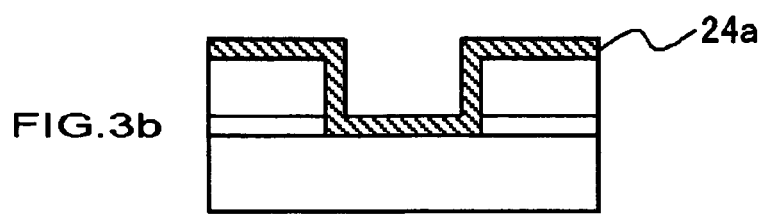

Then Ta and TaN are layered by sputtering and reactive sputtering to form a tantalum family barrier metal layer 24a (thickness of Ta approx. 20 nm, that of TaN approx. 10 nm) all over the substrate (FIG. 3b).

Following the above a seed copper-containing metal layer 60 (approx. 100 nm thick) is formed by sputtering over the tantalum family barrier metal layer 24*a*. While the seed copper-containing metal layer 60 can be solely constituted of copper, it can also contain a dissimilar element similar to those contained in a bias-sputtered copper-containing metal layer 64 to be later described. One or not fewer than two selected out of for instance Ag, W, Mg, Be, Zn, Pd, Cd, Au, Hg, Pt, Si, Zr, Ti or Sn can be cited as examples of such dissimilar element, which shall be described later in details.

Figure 3C:
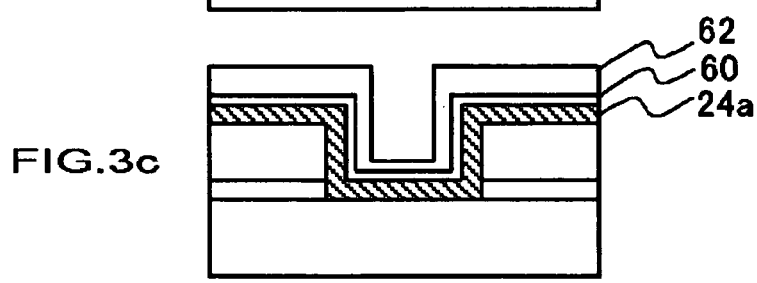

Further, electrolytic plating is performed to form a plated copper layer 62 (thickness approx. 200 nm at a plain portion) over the seed copper-containing metal layer 60 (FIG. 3*c*). For this process an ordinary plating solution such as copper sulfate solution can be employed, while it is preferable to employ a plating solution that does not contain a chloride ion in case where the seed copper-containing metal layer 60 or the bias-sputtered copper-containing metal layer 64 to be later described contains silver as a dissimilar element. In such a case, for example an ordinary copper sulfate solution from which chloride ion has been removed, copper pyrophosphate or ethylene-diamine copper plating solution is preferably employed. Employing such solutions prevents reaction and deposition of the chloride ion and silver in the plated copper layer 62 in a subsequent process, and allows stable formation of the first copper-containing metal interconnect 22*a*. The plated copper layer 62 can be formed for example by dipping the substrate in the plating solution of a temperature of approx. 25 degrees centigrade.

Figure 3D:
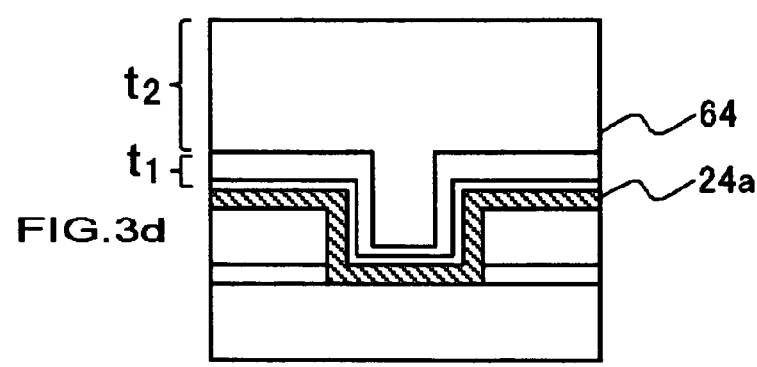

At this stage the plated copper layer 62 has an orientation of (111). Here, a total thickness of the seed copper-containing metal layer 60 and the plated copper layer 62 shall be indicated by $t_1$. It is preferable to form the plated copper layer 62 in such a thickness that does not completely fill the interconnect trench. Copper oxide on a surface of the plated copper layer 62 is then sputtered and reduced by $Ar/H_2$ plasma of a room temperature in a cleaning chamber. And then the substrate is transferred to a copper-containing metal sputtering chamber without exposure to the atmosphere, where bias sputtering for applying an RF (high frequency) bias or DC (direct current) bias to the substrate is performed over the plated copper layer 62, to form a bias-sputtered copper-containing metal layer 64 (thickness approx. 1000 nm at a plain portion), so as to fill the interconnect trench (FIG. 3*d*).

Here, the bias-sputtered copper-containing metal layer 64 can be solely constituted of copper as the seed copper-containing metal layer 60, while it can also contain one or not fewer than two metal elements selected out of for example Ag, Be, Mg, Zn, Pd, Cd, Au, Hg or Pt. Since these metal elements can restrain an increase of resistance of the copper layer even when diffused in the copper layer, resistance of the first copper-containing metal interconnect 22*a* can be maintained at a low level. Also, by constituting the first copper-containing metal interconnect 22*a* with copper and such alloy, stress migration resistance of the copper-containing metal interconnect 22*a* can be improved. Further, the bias-sputtered copper-containing metal layer 64 can contain Zr and/or Ti as a dissimilar element. These metal elements, when diffused in the copper layer, serve to improve adherence of the dielectric layer or barrier metal layer etc. and the first copper-containing metal interconnect 22*a* and the copper layer. Also, in case where a metal having a lower reduction potential than copper, such as Mg, Sn, Zn, Cd, etc. is used as a dissimilar element, corrosion of the metal layer surface can be prevented. Further, the bias-sputtered copper-containing metal layer 64 can contain one or not fewer than two selected out of W, Si or Sn, moreover the bias-sputtered copper-containing metal layer 64 can also contain various combinations of the foregoing dissimilar elements. An upper limit of dissimilar element content of the bias-sputtered copper-containing metal layer 64 is not specifically determined, while it is preferable that a dissimilar element content against the entire constituents of the bias-sputtered copper-containing metal layer 64 is not greater than 5 atomic %, in order to form a copper-containing metal layer 66*a* having a generally uniform orientation and a large grain size through heat treatment, as will be described later. In addition, according to a relation of the atomic standard and mass standard in case where the dissimilar element is silver, for example a silver content of 0.9 atomic % corresponds to 1.5 mass %.

For forming the bias-sputtered copper-containing metal layer 64 an argon ion is irradiated over its sputtered growing surface. In this case it is preferable that ion irradiation energy (plasma potential+self bias) is not less than 80 eV, or more desirably not less than 200 eV. It is preferable to set the substrate temperature at −5 degrees centigrade to prevent excessive temperature increase by the plasma irradiation during the deposition. Also, it is preferable to form the bias-sputtered copper-containing metal layer 64 in such a manner that a thickness thereof $t_2$ becomes greater than the above $t_1$. A preferable total thickness of $t_1$ and $t_2$ is not less than 1 μm. As a result, the seed copper-containing metal layer 60, the plated copper layer 62 and the bias-sputtered copper-containing metal layer 64 attain a generally uniform orientation at the respective surfaces and a large grain size by subsequent heat treatment.

Figure 3E:
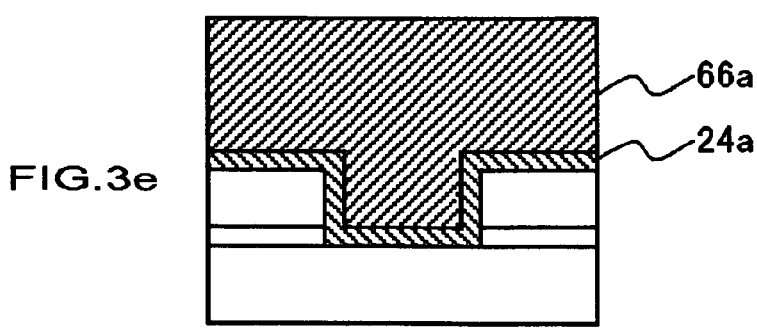

Now heat treatment is performed on the substrate on which the seed copper-containing metal layer 60, the plated copper layer 62 and the bias-sputtered copper-containing metal layer 64 have been formed as above, in an inert gas atmosphere such as argon or nitrogen. This heat treatment can be performed for approx. 30 minutes under a temperature range of 200 to 500 degrees centigrade. Because of such heat treatment, orientation of crystals of the seed copper-containing metal layer 60, plated copper layer 62 and the bias-sputtered copper-containing metal layer 64 turns to (200) which provides high thermal stability, and also the copper-containing metal layer 66*a* having grains as huge as several hundred μm is obtained (FIG. 3*e*). Also, in case where the seed copper-containing metal layer 60 and/or the bias-sputtered copper-containing metal layer 64 contain a dissimilar element, since the dissimilar element diffuses into the plated copper layer 62 owing to the heat treatment, the dissimilar element diffuses uniformly throughout the copper-containing metal layer 66*a*.

Figure 3F:
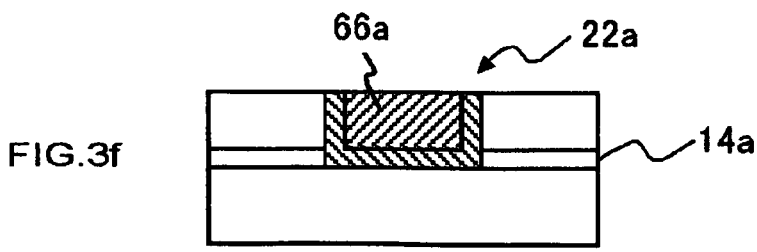

Then, CMP (chemical mechanical polishing) is performed to remove surplus of copper-containing metal layer 66*a* and the tantalum family barrier metal layer 24*a* located outside the interconnect trench, so that the copper-containing metal layer 66*a* etc. remains only inside the interconnect trench, thereby forming the first copper-containing metal interconnect 22*a* (FIG. 3*f*).

According to this embodiment, since the copper-containing metal layer 66*a* is constituted of huge grains of several hundred μm, a grain boundary can scarcely exist on a surface of the first copper-containing metal interconnect 22*a*. Therefore a void can hardly be produced. Also, since the copper-containing metal layer 66*a* is constituted of an alloy of copper and a dissimilar element, strength of the first copper-containing metal interconnect 22*a* can be improved. Further, the heat treatment provides another advantage that resistance of the first copper-containing metal interconnect 22*a* becomes lower than prior to the heat treatment.

Subsequently, a second SiCN layer 16 (thickness approx. 70 nm) and a silicon oxide layer 18 (thickness approx. 350 nm) are deposited (FIG. 4*a*).

Then etching is performed on the silicon oxide layer 18 by lithography method so that the second SiCN layer 16 is exposed, and etching is again performed with a different etching gas on the second SiCN layer 16, to expose an upper surface of the first copper-containing metal interconnect 22a. As a result, a connecting hole 40 is formed as shown in FIG. 4b.

Following the above, a tantalum family barrier metal layer 30 is formed so as to fill the connecting hole 40 (FIG. 4c). On the tantalum family barrier metal layer 30, a seed copper-containing metal layer 70 is formed by sputtering, and a plated copper layer 72 (thickness approx. 200 nm at a plain portion) is formed by electrolytic plating, as in the foregoing process of the first copper-containing metal interconnect 22a (FIG. 4d). Then a bias-sputtered copper-containing metal layer 74 (thickness approx. 1000 nm at a plain portion) is formed on the plated copper layer 72 (FIG. 4e). The bias-sputtered copper-containing metal layer 74 is formed in a similar manner to the bias-sputtered copper-containing metal layer 64 in the process of the first copper-containing metal interconnect 22a. It is preferable to form the bias-sputtered copper-containing metal layer 74 in such a manner that a thickness thereof $t_4$ becomes greater than a total thickness $t_3$ of the seed copper-containing metal layer 70 and the plated copper layer 72.

Then heat treatment is performed on the substrate on which the seed copper-containing metal layer 70, the plated copper layer 72 and the bias-sputtered copper-containing metal layer 74 have been formed. Because of the heat treatment, orientation of crystals of the seed copper-containing metal layer 70, plated copper layer 72 and the bias-sputtered copper-containing metal layer 74 turns to (200), and also the copper-containing metal layer 76 having grains as huge as several hundred μm is obtained (FIG. 4f). Also, in case where the seed copper-containing metal layer 70 and/or the bias-sputtered copper-containing metal layer 74 contain a dissimilar element, since the dissimilar element diffuses into the plated copper layer 72 owing to the heat treatment, the dissimilar element diffuses uniformly throughout the copper-containing metal layer 76. After the heat treatment CMP process is performed for planarization, thus to form a connecting plug 28 (FIG. 4g).

Figure 5:
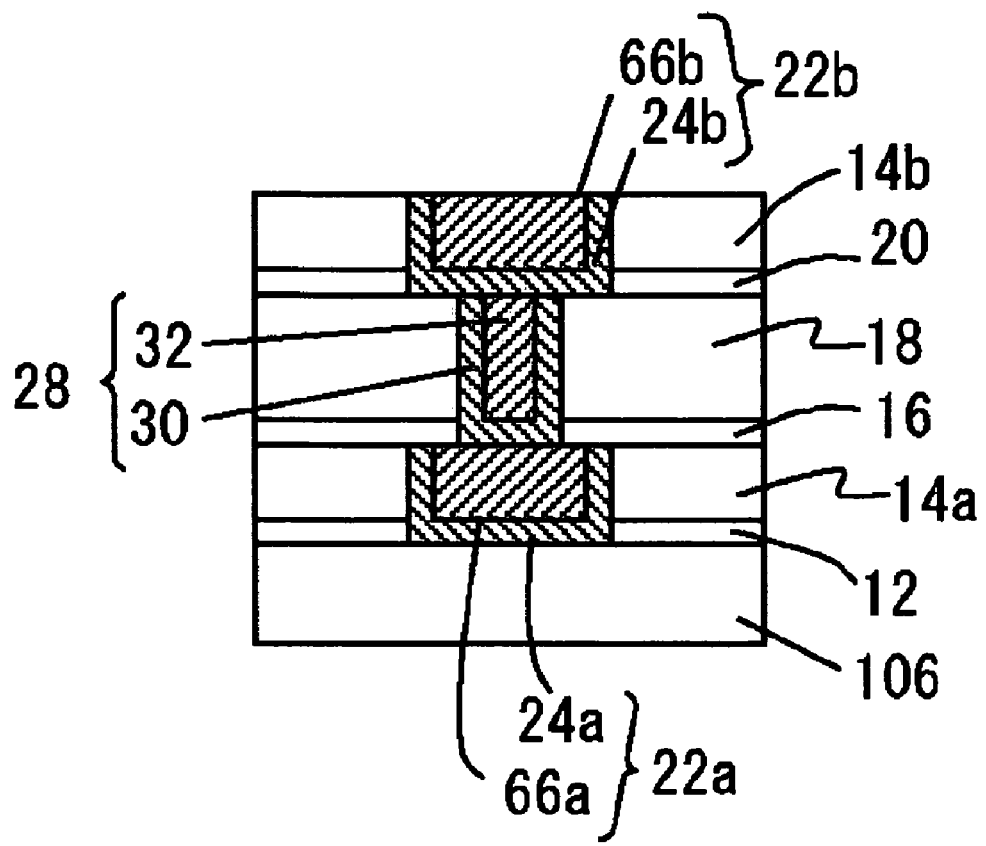
FIG. 5 is a fragmentary schematic cross-sectional view of the interconnect structure of FIG. 2.

Then on the connecting plug 28, a third SiCN layer 20 (thickness approx. 70 nm) and a second HSQ layer 14b (thickness approx. 300 nm) are formed, after which an interconnect trench (not shown) is formed by dry etching and a tantalum family barrier metal layer 24b and copper-containing metal layer 66b are formed in this sequence so as to fill the interconnect trench. The copper-containing metal layer 66b is formed in a similar manner to the copper-containing metal layer 66a in the process of the first copper-containing metal interconnect 22a. CMP process is then performed for planarization, thus to form a second copper-containing metal interconnect 22b. All through the foregoing process, an interconnect structure as shown in FIG. 5 is attained. Repetition of the foregoing process achieves a semiconductor device having a multilayer interconnect structure of not less than three layers as shown in FIG. 2.

The interconnect structure attained as above has improved stress migration resistance, since the copper-containing metal layers 66a, 76 and 66b, respectively constituting the first copper-containing metal interconnect 22a, the connecting plug 28 and the second copper-containing metal interconnect 22b, have a generally uniform surface orientation and a large grain size. It is for the following reasons that the stress migration resistance is improved; firstly because a number of the boundaries between grains is reduced in the first copper-containing metal interconnect 22a, the connecting plug 28 and the second copper-containing metal interconnect 22b, and secondly because the first copper-containing metal interconnect 22a, the connecting plug 28 and the second copper-containing metal interconnect 22b are constituted of an alloy containing copper and a dissimilar element.

With reference to the first copper-containing metal interconnect 22a according to the foregoing embodiment, an actual sample has been manufactured employing a silver-copper alloy containing 0.2% of silver as the seedcopper-containingmetal layer 60 and the bias-sputtered copper-containing metal layer 64. As a result of an inspection of the silver concentration in the copper-containing metal layer 66a by SIMS (secondary ion mass spectroscopy), it has been proven that the silver is uniformly diffused along a direction of thickness of the copper-containing metal layer 66a.

Meanwhile, though the method of the invention is applied to all of the first copper-containing metal interconnect 22a, the connecting plug 28 and the second copper-containing metal interconnect 22b in this embodiment, the invention can be independently applied to the first copper-containing metal interconnect 22a alone, or solely to the connecting plug 28.

Second Embodiment

The second embodiment is different from the first embodiment in that a CVD copper layer 68 is formed by plasma CVD method instead of forming the seed copper-containing metal layer 60 and the plated copper layer 62, when forming the first copper-containing metal interconnect 22a, the connecting plug 28 and the second copper-containing metal interconnect 22b.

This embodiment shall be described referring to FIGS. 6 and 7. After forming the tantalum barrier metal layer 24a, the CVD copper layer 68 (thickness approx. 200 nm at a plain portion) is formed by plasma CVD method (FIG. 6a). At this stage, crystal orientation of the CVD copper layer 68 is (111). It is preferable to form the CVD copper layer 68 in such a thickness that does not completely fill the interconnect trench.

Figure 6A:
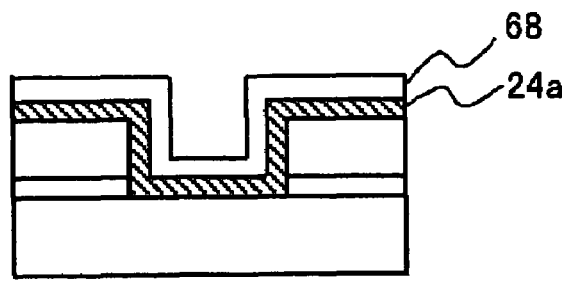
FIGS. 6a, 6b, 6c and 6d are schematic cross-sectional views showing a manufacturing process of an interconnect structure according to the second embodiment.
Figure 6B:
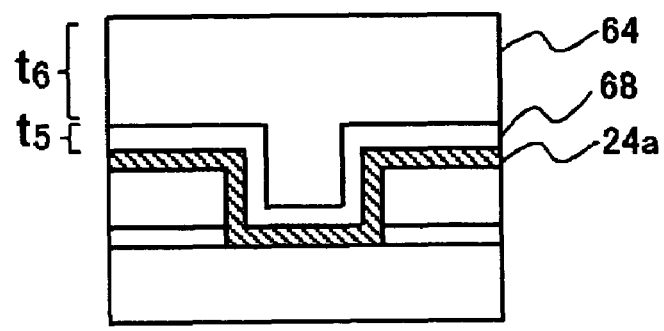

Then, copper oxide on a surface of the CVD copper layer 68 is sputtered and reduced by Ar/$H_2$ plasma of a room temperature in a cleaning chamber. And then the substrate is transferred to a copper-containing metal sputtering chamber without exposure to the atmosphere, where bias sputtering for applying an RF (high frequency) bias or DC (direct current) bias to the substrate is performed over the CVD copper layer 68, to form a bias-sputtered copper-containing metal layer 64 (thickness approx. 1000 nm at a plain portion) (FIG. 6b). Here, the bias-sputtered copper-containing metal layer 64 can contain a dissimilar element as in the first embodiment. Conditions for sputtering are similar to those employed in the first embodiment. And in this embodiment also, it is preferable to form the bias-sputtered copper-containing metal layer 64 in such a manner that a thickness thereof $t_6$ becomes greater than a thickness of the CVD copper layer 68 $t_5$, as in the first embodiment. Also, it is preferable that a total thickness of $t_5$ and $t_6$ is not less than 1 μm.

Figure 6C:
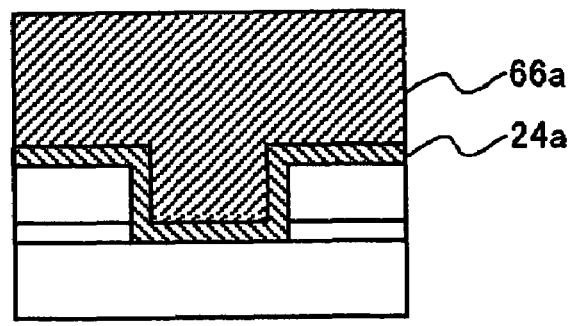

Heat treatment is then performed in an inert gas atmosphere such as argon or nitrogen. This heat treatment can be performed for approx. 30 minutes under a temperature range of 200 to 500 degrees centigrade. Because of such heat treatment, orientation of crystals of the CVD copper layer 68 and the bias-sputtered copper-containing metal layer 64 turns to (200), and also the copper-containing metal layer 66a having grains as huge as several hundred μm is obtained (FIG. 6c).

Figure 6D:
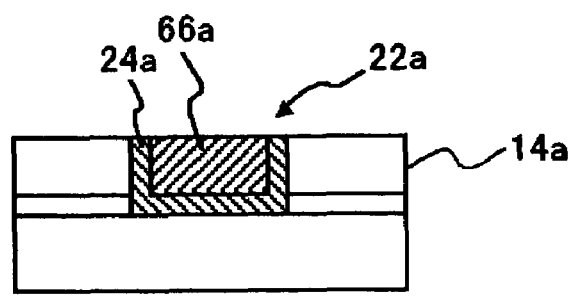

Then, CMP (chemical mechanical polishing) is performed to remove surplus of copper-containing metal layer 66a and the tantalum family barrier metal layer 24a located outside the interconnect trench, so that the copper-containing metal layer 66a etc. remains only inside the interconnect trench, thereby forming the first copper-containing metal interconnect 22a (FIG. 6d). Also, in case where the bias-sputtered copper-containing metal layer 64 contains a dissimilar element, since the dissimilar element diffuses in the CVD copper layer 68 owing to the heat treatment, the dissimilar element diffuses uniformly throughout the copper-containing metal layer 66a.

Subsequently, a second SiCN layer 16 (thickness approx. 70 nm) and a silicon oxide layer 18 (thickness approx. 350 nm) are deposited (FIG. 7a).

Then etching is performed on the silicon oxide layer 18 by lithography method so that the second SiCN layer 16 is exposed, and etching is again performed with a different etching gas on the second SiCN layer 16, to expose an upper surface of the first copper-containing metal interconnect 22a. As a result, a connecting hole 40 is formed as shown in FIG. 7b.

Following the above, a tantalum family barrier metal layer 30 is formed in the connecting hole 40 (FIG. 7c). On the tantalum family barrier metal layer 30, a CVD copper layer 78 (thickness approx. 200 nm at a plain portion) is formed by plasma CVD method, as in the foregoing process of the first copper-containing metal interconnect 22a (FIG. 7d). Then a bias-sputtered copper-containing metal layer 74 (thickness approx. 1000 nm at a plain portion) is formed on the CVD copper layer 78 (FIG. 7e). The bias-sputtered copper-containing metal layer 74 is formed in a similar manner to the bias-sputtered copper-containing metal layer 64 in the process of the first copper-containing metal interconnect 22a. It is preferable to form the bias-sputtered copper-containing metal layer 74 in such a manner that a thickness thereof $t_8$ becomes greater than a thickness $t_7$ of the CVD copper layer 78.

Then heat treatment is performed on the substrate on which the CVD copper layer 78 and the bias-sputtered copper-containing metal layer 74 have been formed. Because of the heat treatment, orientation of crystals of the CVD copper layer 78 and the bias-sputtered copper-containing metal layer 74 turns to (200), and also the copper-containing metal layer 76 having grains as huge as several hundred μm is obtained (FIG. 7f). Also, in case where the bias-sputtered copper-containing metal layer 74 contains a dissimilar element, since the dissimilar element diffuses in the CVD copper layer 78 owing to the heat treatment, the dissimilar element diffuses uniformly throughout the copper-containing metal layer 76. After the heat treatment CMP process is performed for planarization, thus to form a connecting plug 28 (FIG. 7g).

Then on the connecting plug 28, a third SiCN layer 20 (thickness approx. 70 nm) and a second HSQ layer 14b (thickness approx. 300 nm) are formed, after which an interconnect trench (not shown) is formed by dry etching and a tantalum family barrier metal layer 24b and copper-containing metal layer 66b are formed in this sequence so as to fill the interconnect trench. The copper-containing metal layer 66b is formed in a similar manner to the copper-containing metal layer 66a in the process of the first copper-containing metal interconnect 22a. CMP process is then performed for planarization, thus to form a second copper-containing metal interconnect 22b. All through the foregoing process, an interconnect structure as shown in FIG. 5 is attained, as described regarding the first embodiment. Repetition of the foregoing process achieves a semiconductor device having a multilayer interconnect structure of not less than three layers as shown in FIG. 2.

The interconnect structure attained as above has improved stress migration resistance, since the copper-containing metal layers 66a, 76 and 66b, respectively constituting the first copper-containing metal interconnect 22a, the connecting plug 28 and the second copper-containing metal interconnect 22b, have a generally uniform surface orientation and a large grain size. It is for the following reasons that the stress migration resistance is improved; firstly because a number of the boundaries between grains is reduced in the first copper-containing metal interconnect 22a, the connecting plug 28 and the second copper-containing metal interconnect 22b, and secondly because the first copper-containing metal interconnect 22a, the connecting plug 28 and the second copper-containing metal interconnect 22b are constituted of an alloy containing copper and a dissimilar element.

Third Embodiment

The third embodiment is different from the first embodiment in that the connecting plug 28 and the second copper-containing metal interconnect 22b by dual Damascene method. Referring to FIGS. 8 and 9, similar components to those in FIGS. 3 to 5 referred to in the first embodiment are given the identical numerals, and description thereof shall be omitted as the case may be.

The first copper-containing metal interconnect 22a can be formed in a similar manner to the preceding description of the first embodiment referring to FIG. 3, or to the following description on the second copper-containing metal interconnect 22b.

Figure 8A:
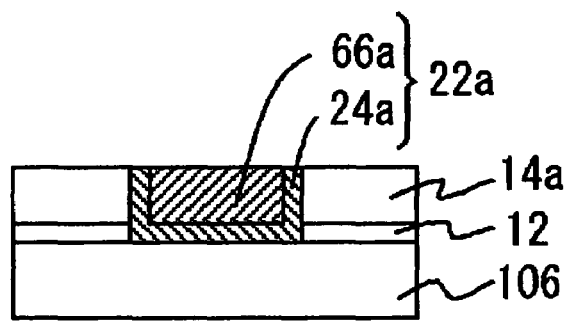
FIGS. 8a, 8b, 8c, and 8d are schematic cross-sectional views showing a manufacturing process of an interconnect structure according to the third embodiment.
Figure 8B:
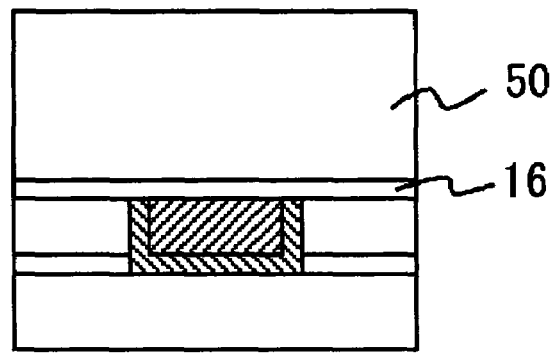
Figure 8C:
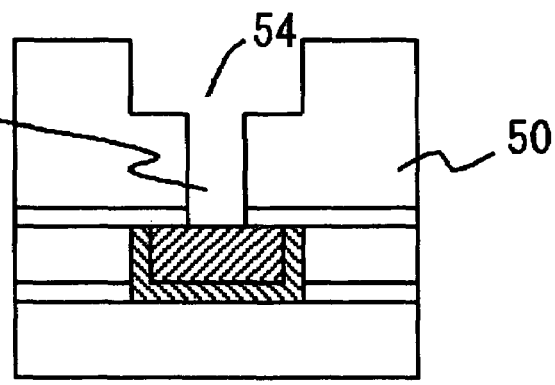
Figure 8D:
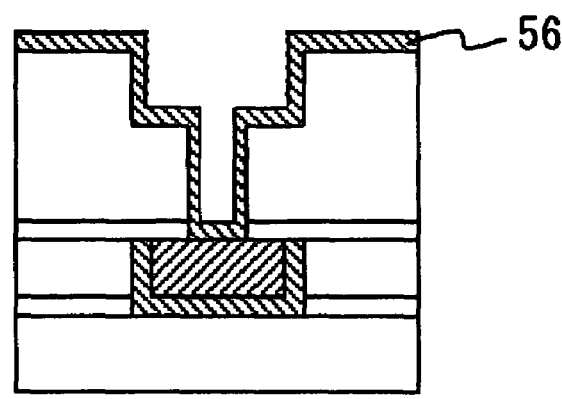

After forming the first copper-containing metal interconnect 22a (FIG. 8a), the second SiCN layer 16 and a silicon oxide layer 50 are deposited (FIG. 8b). Then progressive etching is performed on the silicon oxide layer 50 utilizing lithography method, to form a connecting hole 52 and an interconnect trench 52 for the connecting plug 28. And etching is again performed with a different etching gas on the second SiCN layer 16 (FIG. 8c). After that, a tantalum family barrier metal layer 56 consisting of layers of Ta and TaN is formed all over the silicon oxide layer 50 including the connecting hole 52 and the interconnect trench 54 (FIG. 8d).

Following the above a seed copper-containing metal layer 80 (approx. 100 nm thick) is formed by sputtering over the tantalum family barrier metal layer 56 (FIG. 9a). While the seed copper-containing metal layer 80 can be solely constituted of copper, it can also contain a dissimilar element as the seed copper-containing metal layer 60 of the first embodiment. And then electrolytic plating is performed to form a plated copper layer 82 (thickness approx. 200 nm at a plain portion) over the seed copper-containing metal layer 80 (FIG. 9b). At this stage the plated copper layer 82 has an orientation of (111). Here, a total thickness of the seed copper-containing metal layer 80 and the plated copper layer 82 shall be indicated by $t_9$.

Copper oxide on a surface of the plated copper layer 82 is then sputtered and reduced by Ar/Hv plasma of a room temperature in a cleaning chamber. And then the substrate is transferred to a copper-containing metal sputtering chamber without exposure to the atmosphere, where an RF (high frequency) bias or DC (direct current) bias is applied to the substrate, to form a bias-sputtered copper-containing metal layer 84 (thickness approx. 1000 nm at a plain portion) (FIG. 9c). Here, the bias-sputtered copper-containing metal layer 84 can contain a dissimilar element as the copper-containing metal layer 64 in the first embodiment. For forming the bias-sputtered copper-containing metal layer 84 an argon ion is irradiated over its sputtered growing surface. In this case it is preferable that ion irradiation energy (plasma potential+self bias) to be applied to the silicon substrate is a high bias for example not less than 80 eV, or more desirably not less than 200 eV. It is preferable to set the substrate temperature at −5 degrees centigrade to prevent excessive temperature increase by the plasma irradiation during the deposition. Also, it is preferable to form the bias-sputtered copper-containing metal layer 84 in such a manner that a thickness thereof $t_{10}$ becomes greater than the above $t_9$. A preferable total thickness of $t_9$ and $t_{10}$ is not less than 1 μm.

Now heat treatment is performed on the substrate on which the seed copper-containing metal layer 80, the plated copper layer 82 and the bias-sputtered copper-containing metal layer 84 have been formed, in an inert gas atmosphere such as argon or nitrogen. This heat treatment can be performed for approx. 30 minutes under a temperature range of 200 to 500 degrees centigrade. Because of such heat treatment, orientation of crystals of the seed copper-containing metal layer 80, plated copper layer 82 and the bias-sputtered copper-containing metal layer 84 turns to (200), and also the copper-containing metal layer 86 having grains as huge as several hundred μm is obtained (FIG. 9*d*). Also, in case where the seed copper-containing metal layer 80 and/or the bias-sputtered copper-containing metal layer 84 contain a dissimilar element, since the dissimilar element diffuses into the plated copper layer 82 owing to the heat treatment, the dissimilar element diffuses uniformly throughout the copper-containing metal layer 86. CMP process is then performed for planarization, thus to form the connecting plug 28 and the second copper-containing metal interconnect 22*b* (FIG. 9*e*).

According to this embodiment, since the copper-containing metal layer 86 is constituted of huge grains of several hundred μm, a grain boundary can scarcely exist on a surface of the connecting plug 28 and second copper-containing metal interconnect 22*b*. Therefore a void can hardly be produced. Also, since the copper-containing metal layer 86 is constituted of an alloy of copper and a dissimilar element, strength of the connecting plug 28 and the second copper-containing metal interconnect 22*b* can be improved. Further, the heat treatment provides another advantage that resistance of the first copper-containing metal interconnect 22*a* and the connecting plug 28 becomes lower than prior to the heat treatment.

Fourth Embodiment

Figure 10A:
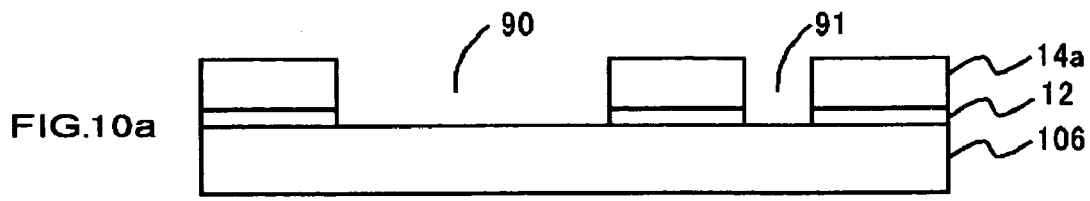
FIGS. 10a, 10b, 10c, 10d, 10e, and 10f are schematic cross-sectional views showing a manufacturing process of an interconnect structure according to the fourth embodiment.
Figure 10B:
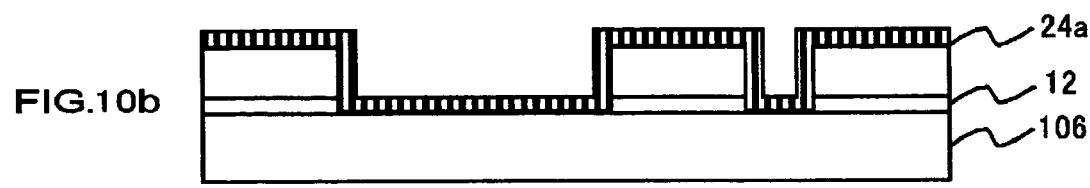
Figure 10C:
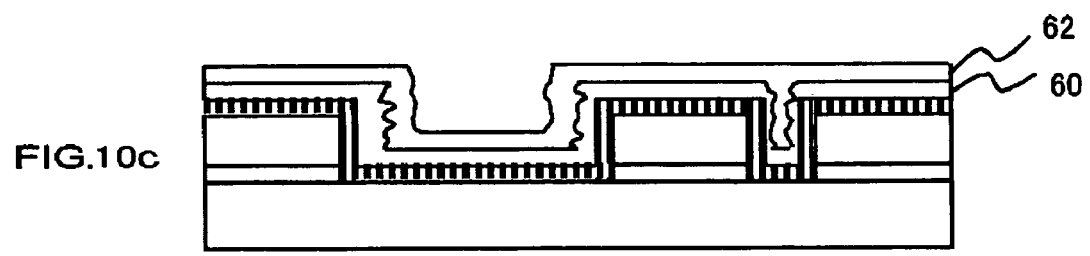
Figure 10D:
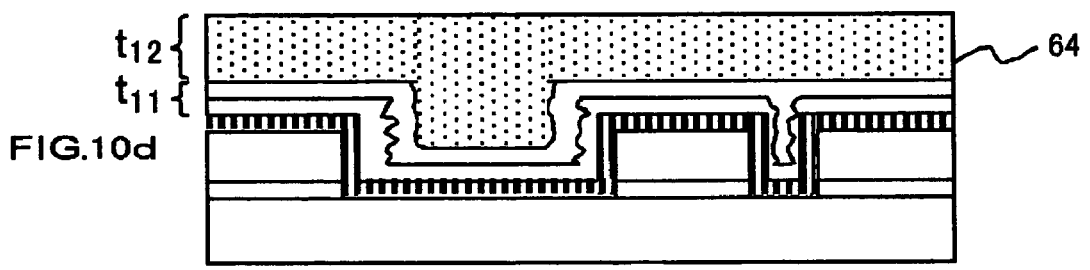
Figure 10E:
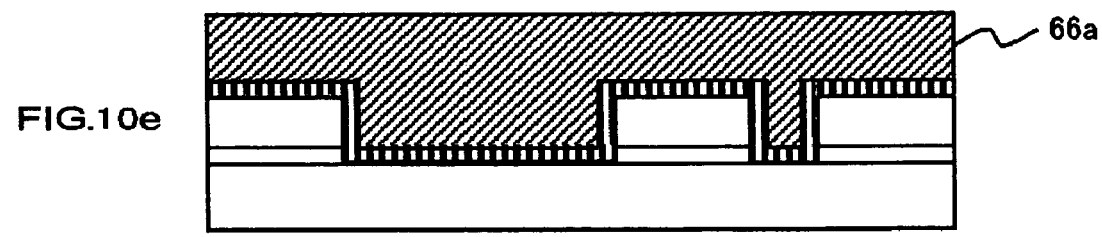
Figure 10F:
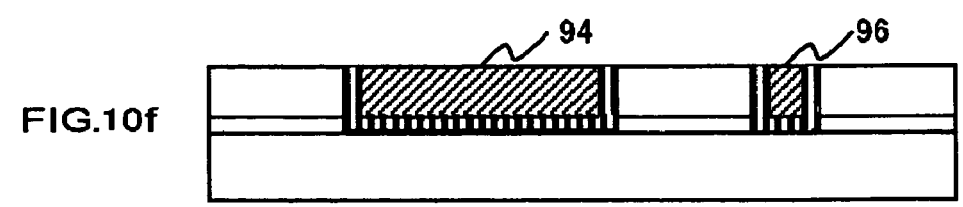
Figure 11A:
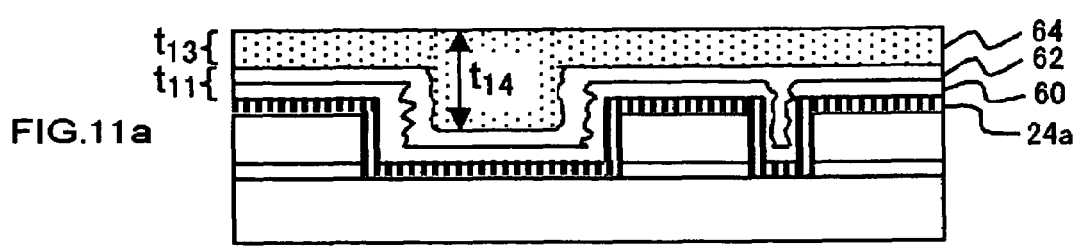
FIGS. 11a, 11b, and 11c are schematic cross-sectional views showing a manufacturing process of an interconnect structure according to the fifth embodiment.

This embodiment represents a manufacturing method of two interconnects having different widths, and the description thereof shall be given hereunder referring to FIGS. 11*a* to 10*f*. Hereinafter, similar components to those in FIGS. 3*a* to 5 referred to in the first embodiment are given the identical numerals, and description thereof shall be omitted as the case may be.

Firstly, on the dielectric layer 106 formed on a silicon substrate (not shown), a first SiCN layer 12 and a first HSQ layer 14*a* are formed, on which a resist layer (not shown) patterned in a prescribed design is then provided, and progressive etching is performed on the first SiCN layer 12 and the first HSQ layer 14*a* to form a first interconnect trench 90 and a second interconnect trench 91 (FIG. 10*a*). Here, the first interconnect trench 90 is formed wider than the second interconnect trench 91. For example, the first interconnect trench 90 can be not less than 1 μm wide, while forming the second interconnect trench 91 narrower than 1 μm.

Then Ta and TaN are layered by sputtering and reactive sputtering to form a tantalum family barrier metal layer 24*a* (thickness of Ta approx. 20 nm, that of TaN approx. 10 nm) all over the substrate (FIG. 10*b*).

Following the above a seed copper-containing metal layer 60 (approx. 100 nm thick) is formed by sputtering over the tantalum family barrier metal layer 24*a*. Electrolytic plating is then performed to form a plated copper layer 62 (thickness approx. 200 nm at a plain portion) over the seed copper-containing metal layer 60 (FIG. 10*c*). The plated copper layer 62 can be formed in a similar manner to the first embodiment. At this stage the plated copper layer 62 has an orientation of (111). It is preferable to form the plated copper layer 62 in such a thickness that does not completely fill the first interconnect trench 90.

Then, copper oxide on a surface of the plated copper layer 62 is sputtered and reduced by $Ar/H_2$ plasma of a room temperature in a cleaning chamber. And then the substrate is transferred to a copper-containing metal sputtering chamber without exposure to the atmosphere, where bias sputtering for applying an RF (high frequency) bias or DC (direct current) bias to the substrate is performed over the plated copper layer 62, to form a bias-sputtered copper-containing metal layer 64, so as to fill the first interconnect trench 90 (FIG. 10*d*). Conditions for sputtering are similar to those employed in the first embodiment. And in this embodiment also, it is preferable to form the bias-sputtered copper-containing metal layer 64 in such a manner that a thickness thereof $t_{12}$ at its plain portion becomes greater than a total thickness $t_{11}$ of the plated copper layer 62 and the seed copper-containing metal layer 60, as in the first embodiment. Also, it is preferable that a total thickness of $t_{11}$ and $t_{12}$ is not less than 1 μm.

Now heat treatment is performed on the substrate on which the seed copper-containing metal layer 60, the plated copper layer 62 and the bias-sputtered copper-containing metal layer 64 have been formed as above, in an inert gas atmosphere such as argon or nitrogen. This heat treatment can be performed for approx. 30 minutes under a temperature range of 200 to 500 degrees centigrade. Because of such heat treatment, orientation of crystals of the seed copper-containing metal layer 60, plated copper layer 62 and the bias-sputtered copper-containing metal layer 64 turns to (200), and also the copper-containing metal layer 66*a* having grains as huge as several hundred μm is obtained (FIG. 10*e*). Also, in case where the seed copper-containing metal layer 60 and/or the bias-sputtered copper-containing metal layer 64 contain a dissimilar element, since the dissimilar element diffuses into the plated copper layer 62 owing to the heat treatment, the dissimilar element diffuses uniformly throughout the copper-containing metal layer 66*a*.

Then, CMP method is performed to remove surplus of copper-containing metal layer 66*a* and the tantalum family barrier metal layer 24*a* located outside the first interconnect trench 90 and the second interconnect trench 91, so that the copper-containing metal layer 66*a* etc. remains only inside the first interconnect trench 90 and the second interconnect trench 91, thereby forming a wide interconnect 94 and a narrow interconnect 96 (FIG. 10*f*).

As a result of the foregoing process, both of the wide interconnect 94 and the narrow interconnect 96 are constituted of the copper-containing metal layer 66*a* having an orientation of (200) at its surface. Also, in case where the seed copper-containing metal layer 60 and/or the bias-sputtered copper-containing metal layer 64 contain a dissimilar element, since the dissimilar element diffuses into the plated copper layer 62 owing to the heat treatment, the dissimilar element diffuses uniformly throughout the copper-containing metal layer 66a, in both of the wide interconnect 94 and the narrow interconnect 96.

Fifth Embodiment

This embodiment also relates to a manufacturing method of two interconnects having different widths, as the fourth embodiment. In this embodiment, thickness of the bias-sputtered copper-containing metal layer 64 is different from that of the fourth embodiment. Changing the thickness of the bias-sputtered copper-containing metal layer 64 results in a different orientation at a surface of a copper-containing metal layer constituting the wide interconnect 94 and the narrow interconnect 96, as well as in a different diffusion status of a dissimilar element in case where the copper-containing metal layer contains a dissimilar element. Detailed description shall be given hereunder referring to FIGS. 10a to 11c.

Firstly, the tantalum family barrier metal layer 24a is formed on the first interconnect trench 90 and the second interconnect trench 91, according to the process of FIGS. 10a to 10c as explained in the fourth embodiment. After that, the seed copper-containing metal layer 60 is formed on the tantalum family barrier metal layer 24a by sputtering, and further the plated copper layer 62 is formed on the seed copper-containing metal layer 60. In this embodiment, the seed copper-containing metal layer 60 does not necessarily have to contain a dissimilar element. Also, the plated copper layer 62 is formed in such a thickness that does not completely fill the first interconnect trench 90.

Then, copper oxide on a surface of the plated copper layer 62 is sputtered and reduced by $Ar/H_2$ plasma of a room temperature in a cleaning chamber. And then the substrate is transferred to a copper-containing metal sputtering chamber without exposure to the atmosphere, where bias sputtering for applying an RF (high frequency) bias or DC (direct current) bias to the substrate is performed over the plated copper layer 62, to form a bias-sputtered copper-containing metal layer 64, so as to fill the first interconnect trench 90 (FIG. 11a). Forming process of the bias-sputtered copper-containing metal layer 64, such as conditions for sputtering etc., is similar to those employed in the fourth embodiment, while in this embodiment it is preferable to form the bias-sputtered copper-containing metal layer 64 in such a manner that a thickness thereof $t_{13}$ at its plain portion becomes not greater than a total thickness $t_{11}$ of the plated copper layer 62 and the seed copper-containing metal layer 60. At this stage however, it is preferable to form the bias-sputtered copper-containing metal layer 64 so that a thickness thereof $t_{14}$ at a portion inside the first interconnect 90 becomes greater than the above thickness $t_{11}$.

Figure 11B:
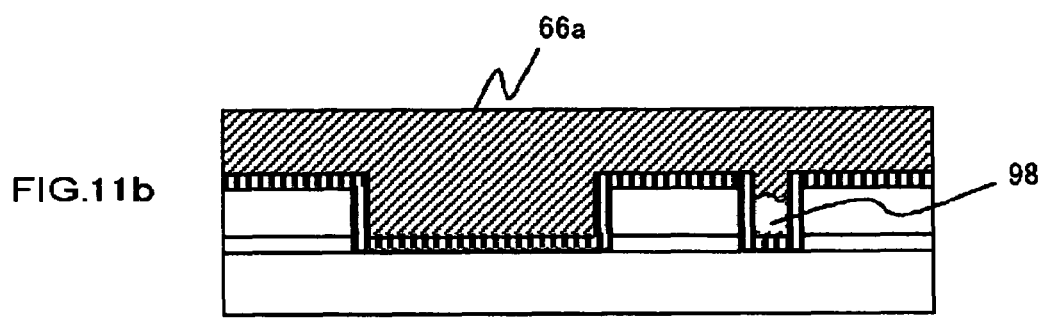

Now heat treatment is performed on the substrate on which the seed copper-containing metal layer 60, the plated copper layer 62 and the bias-sputtered copper-containing metal layer 64 have been formed as above, in an inert gas atmosphere such as argon or nitrogen, under a temperature range of 200 to 500 degrees centigrade. Because of such heat treatment, a dissimilar element contained in the bias-sputtered copper-containing metal layer 64 diffuses into the plated copper layer 62 and the seed copper-containing metal layer 60, thereby forming the copper-containing metal layer 66a (FIG. 11b). At this stage orientation of crystals of the seed copper-containing metal layer 60, plated copper layer 62 and the bias-sputtered copper-containing metal layer 64 located inside and over the first interconnect trench 90 turns to (200), and also grains as huge as several hundred μm are obtained. Now, the heat treatment can be performed for a relatively short period of time such as five to ten minutes, by lamp annealing. As a result, since the bias-sputtered copper-containing metal layer 64 occupies a major part of the first interconnect trench 90, the dissimilar element can uniformly diffuse throughout the first interconnect trench 90 by heat treatment of a short time, while since a major part of the second interconnect trench 91 is filled with the seed copper-containing metal layer 60 and the plated copper layer 62, the dissimilar element can only diffuse at an upper portion of the second interconnect trench 91.

Figure 11C:
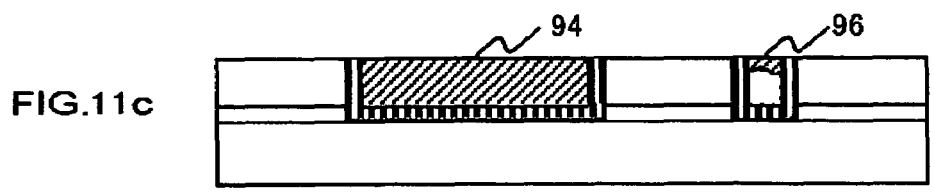

Then, CMP method is performed to remove surplus of copper-containing metal layer 66a and the tantalum family barrier metal layer 24a located outside the first interconnect trench 90 and the second interconnect trench 91, so that the copper-containing metal layer 66a etc. remains only inside the first interconnect trench 90 and the second interconnect trench 91, thereby forming a wide interconnect 94 and a narrow interconnect 96 (FIG. 11c).

As a result of the foregoing process, the wide interconnect 94 is constituted of the copper-containing metal layer 66a having an orientation of (200) at its surface. By contrast, the narrow interconnect 96 is constituted of a copper-containing metal layer 98 having an orientation of (111) at its surface. Also, in case where the bias-sputtered copper-containing metal layer 64 contain a dissimilar element, the dissimilar element diffuses into the plated copper layer 62 owing to the heat treatment. In the wide interconnect 94 the dissimilar element diffuses uniformly throughout the interconnect, while in the narrow interconnect 96 the dissimilar element diffuses only at an upper portion of the interconnect.

Consequently, according to this embodiment the wide interconnect, which is more susceptible to stress migration, can be formed in a larger grain size, with the dissimilar element uniformly diffused throughout the interconnect, and in the narrow interconnect wherein reduction of resistance is the major issue the dissimilar element is diffused only at an upper portion of the interconnect. In this way stress migration resistance of the wide interconnect can be improved, and interconnect resistance in the narrow interconnect can be reduced.

Sixth Embodiment

This embodiment is an example wherein the invention is applied to an electrode pad. With an object to examine electric characteristics of a semiconductor device formed on a semiconductor wafer, such a method is popularly adopted wherein an electrode pad for inspection is formed in advance in a device to be examined, so that a sensing probe can make contact with the electrode pad. Hereafter, a manufacturing method of a semiconductor device in which an electrode pad for inspection is provided shall be described referring to FIGS. 12a to 13b.

Figure 12A:
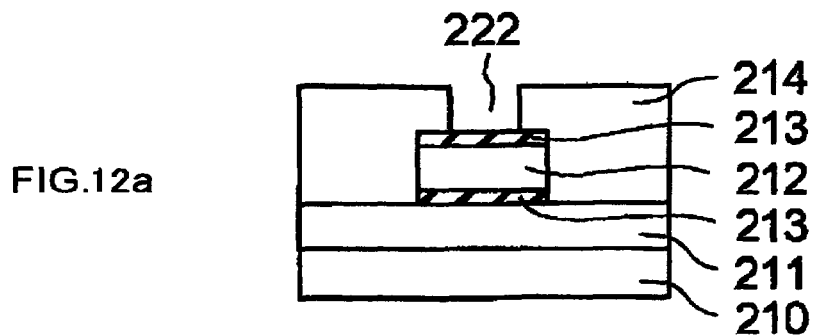
FIGS. 12a, 12b, 12c, and 12d are schematic cross-sectional views showing a manufacturing process of an electrode pad according to the sixth embodiment.

To start with, a multilayer 211 consisting of layers of an interconnect and an interlayer dielectric film etc. is formed on a silicon substrate 210. An interconnect layer consisting of a Tin/Ti layer 213, an aluminum interconnect 212 and another Tin/Ti layer 213 is formed on a topmost interlayer dielectric film. Then an interlayer dielectric film 214 consisting of two layers including SiON and $SiO_2$ is formed, and thereby a via hole 222 reaching an upper surface of the interconnect layer is formed (FIG. 12a).

Figure 12B:
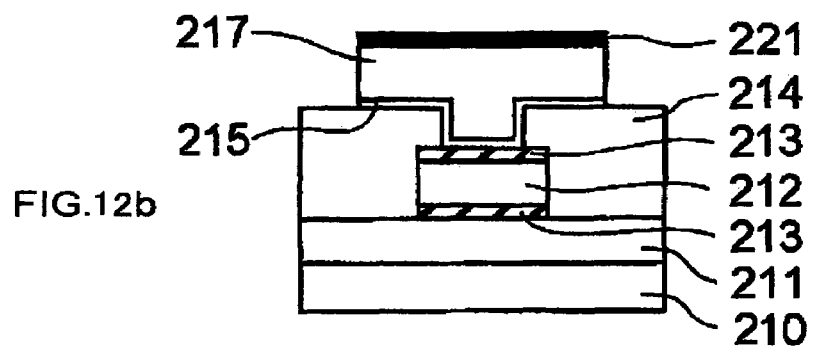

Following the above an adhered Ti layer (or TiW layer) 215, a copper-containing metal layer 217 and a TiW layer 221 are sequentially formed on the interlayer dielectric film 214, after which patterning is performed in a dimension appropriate for loading a soldering ball, thus to form a pad electrode (FIG. 12b). The copper-containing metal layer 217 is formed in a similar way to the copper-containing metal layer 66a described in the first embodiment. Firstly a seed copper-containing metal layer (thickness approx. 100 nm) is formed by sputtering on the Ti layer (or TiW layer) 215, over which a plated copper layer (thickness approx. 200 nm at a plain portion) is formed. Then a bias-sputtered copper-containing metal layer (thickness approx. 1000 nm at a plain portion) is formed on the plated copper layer by bias sputtering method. Here, the seed copper-containing metal layer can be solely constituted of copper, while it can contain one or not fewer than two dissimilar elements selected out of metals having a lower oxidation-reduction potential than copper, such as Mg, Sn, Zn, Cd, etc. The bias-sputtered copper-containing metal layer can also contain such dissimilar element. Now heat treatment is performed on the substrate on which the seed copper-containing metal layer, the plated copper layer and the bias-sputtered copper-containing metal layer have been formed as above, in an inert gas atmosphere such as argon or nitrogen. This heat treatment can be performed for approx. 30 minutes under a temperature range of 200 to 500 degrees centigrade. Because of such heat treatment, orientation of crystals of the seed copper-containing metal layer, plated copper layer and the bias-sputtered copper-containing metal layer turns to (200), and also the copper-containing metal layer 217 having grains as huge as several hundred μm is obtained. Also, since a dissimilar element contained in the seed copper-containing metal layer and/or the bias-sputtered copper-containing metal layer diffuses into the plated copper layer, the dissimilar element diffuses uniformly throughout the copper-containing metal layer 217.

Figure 12C:
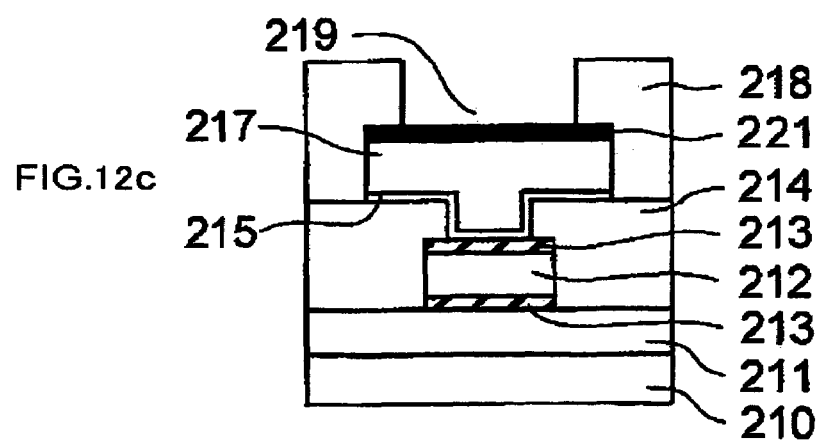
Figure 12D:
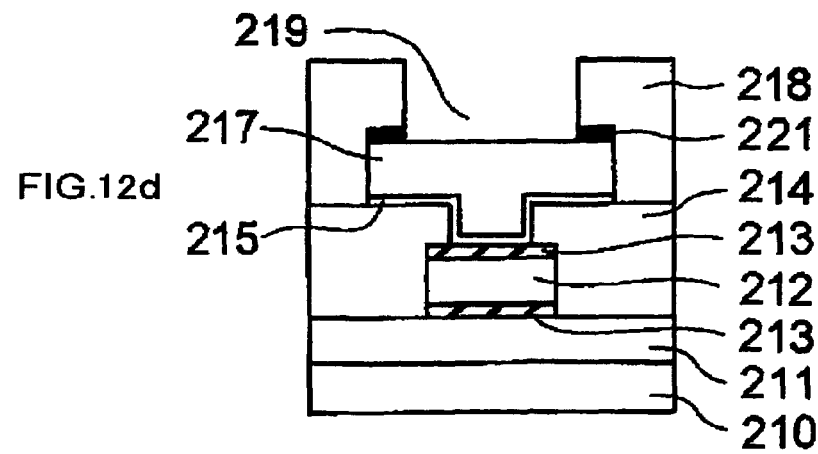

A polyimide layer 218 is then formed so as to cover the pad electrode, and an opening is provided on the polyimide layer 218 by patterning so that a part of the pad electrode is exposed (FIG. 12c). After this, the TiW layer 221 at a bottom portion of the opening is removed by wet etching utilizing hydrogen peroxide solution in water, so that a structure shown in FIG. 12d is attained.

Under such state, inspection of electric characteristics of the semiconductor device formed on the semiconductor wafer is performed. At this stage an oxide layer 223 of copper is formed at a surface of the copper-containing metal layer 217 (FIG. 13a), and subsequently a soldering ball 220 is formed in the opening 219 (FIG. 13b).

In this embodiment, since the pad electrode is constituted of a copper-containing metal containing a dissimilar element having a high corrosion resistance, corrosion during the manufacturing process can be prevented.

EXAMPLE

Figure 14:
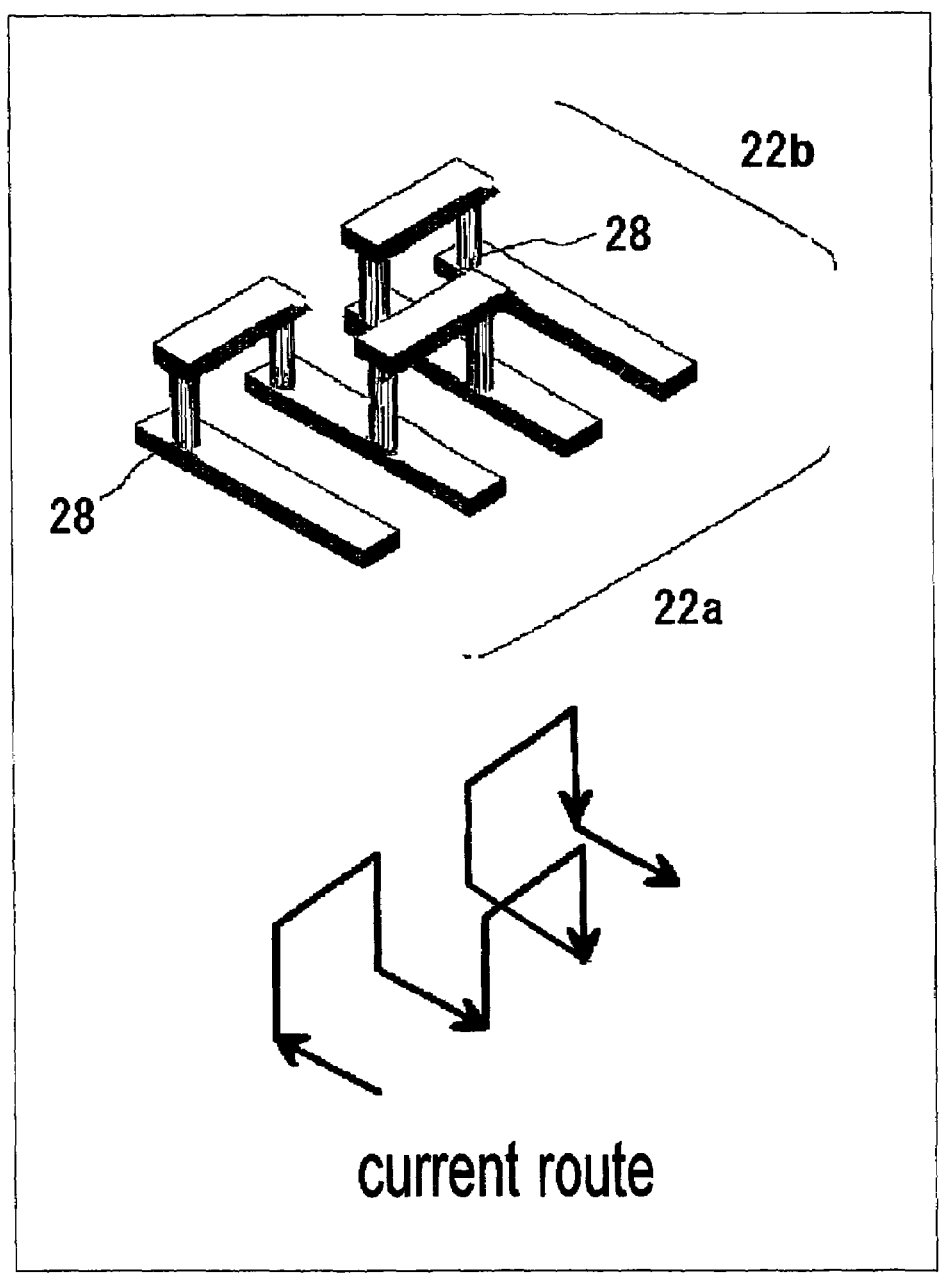
FIG. 14 is a schematic perspective view showing a dual level interconnect structure employed for evaluation of the embodiments.

A dual-layer interconnect structure as shown in FIG. 14 was made up according to the steps described in the first embodiment, and yield evaluation has been performed. This dual-layer interconnect structure is of a so-called "via chain" type, wherein 10000 lines of first copper-containing metal interconnects 22a are disposed in parallel, and 10000 lines of second copper-containing metal interconnects 22b are disposed in parallel, orthogonally across the first copper-containing metal interconnects. These interconnects are connected through 20000 pieces of connecting plugs 28. The semiconductor substrate and the interlayer dielectric films etc. are omitted from the drawing. When a predetermined voltage is applied to two points at an end portion of this via chain, current runs in a direction indicated by an arrow in the drawing. Under such configuration, electric resistance through the 10,000 first copper-containing metal interconnects 22a, 10,000 second copper-containing metal interconnects 22b and 20,000 connecting plugs 28 can be measured.

Here, referring to the copper-containing metal layer 66a, 76 and 66b described according to the first embodiment, a sample that contains 0.1% of silver against the entire metals of the copper-containing metal layer is denoted as interconnect structure a1, and a sample that does not contain silver is denoted as interconnect structure a2.

Also as a reference, yield of a via chain resistance was measured with respect to an interconnect made by forming the seed copper-containing metal layer 60, forming a plated copper layer by plating so as to fill the interconnect trench and then annealing, and also with respect to a connecting plug made in a similar way. Referring to these items, a sample that contains 0.1% of silver against the entire metals of the interconnect and the connecting plug is denoted as interconnect structure a3, and a sample that does not contain silver is denoted as interconnect structure a4.

TABLE 1

| interconnect structure | deposition method | silver content in wt. % | yield |
| --- | --- | --- | --- |
| a1 | plating → bias sputtering | 0.1 | 88~98 |
| a2 | plating → bias sputtering | 0 | 78~84 |
| a3 | plating | 0.1 | 72~82 |
| a4 | plating | 0 | 8~19 |

With reference to the interconnect structures a1 to a4, relative values of resistance of the respective samples have been worked out, defining an initial resistance value of the via chain as 100%. The reason why the table 1 shows a certain range of the resistance value is that a plurality of the above samples were prepared for evaluation, from which a plurality of results have been recorded. The higher the value is, the higher stress migration resistance the item has attained.

As is apparent in view of the table 1, the interconnect structures a1 and a2, made through heat treatment of a copper-containing metal layer formed by plating and bias sputtering so that a crystal orientation at its surface becomes (200) and grains grow larger show evidently better values than the interconnects a3 and a4 made merely through heat treatment after plating.

Also, the interconnect structure a1 containing silver as a dissimilar element among the metals constituting the interconnect shows better values than the interconnect a2 solely constituted of copper. In view of such result of the foregoing working examples, it has been proven that achieving a generally uniform orientation at a surface of the copper-containing metal layer and making larger grains to reduce a number of the grains located at the surface of the copper-containing metal layer are effective in restraining stress migration. Further, it has also been proven that constituting the interconnect with a copper alloy containing a dissimilar element such as silver serves to effectively restrain the stress migration.

According to the invention, resistance against EM and stress migration of a semiconductor device having a metal region can be improved. Also, the invention provides manufacturing method that enables production of such semiconductor device at a stable quality level.

Although the present invention has been described by way of exemplary embodiments, it should be understood that many changes and substitutions may further be made by those skilled in the art without departing from the scope of the present invention which is defined by the appended claims.

What is claimed is:

1. A manufacturing method of a semiconductor device comprising:
   forming a dielectric layer on a semiconductor substrate;
   forming a recess on said dielectric layer;
   forming a first metal layer so as to fill a portion of said recess;
   forming a second metal layer on said first metal layer so as to fill a remaining portion of said recess, said second metal layer being formed by a bias sputtering method; and
   performing heat treatment of said first metal layer and said second metal layer,
   wherein said second metal layer comprises at least one dissimilar element different from a main constituent of said first metal layer.

2. The manufacturing method as set forth in claim 1, wherein said second metal layer contains a metal that is the main constituent of said first layer and at least one dissimilar element from said metal.

3. The manufacturing method as set forth in claim 1, further comprising removing said first metal layer and said second metal layer formed outside said recess.

4. The manufacturing method as set forth in claim 1, wherein a surface of said first metal layer and a surface of said second metal layer are formed in a generally uniform orientation through said heat treatment process.

5. The manufacturing method as set forth in claim 1, wherein said first metal layer and said second metal layer are formed in an average grain size of not less than 1 μm through said heat treatment process.

6. The manufacturing method as set forth in claim 1, wherein a surface of said first metal layer and a surface of said second metal layer are formed in an orientation of (200) through said heat treatment process.

7. The manufacturing method as set forth in claim 1, wherein a surface of said dissimilar element-diffused metal layer attains an orientation of (200) through said forming said dissimilar element-diffused metal layer.

8. The manufacturing method as set forth in claim 1, wherein a thickness of said second metal layer at a plain portion thereof is made greater than a thickness of said first metal layer at a plain portion thereof.

9. The manufacturing method as set forth in claim 1, wherein said forming said first metal layer comprises a plating.

10. The manufacturing method as set forth in claim 9, wherein said plating employs a plating solution devoid of a chloride ion.

11. The manufacturing method as set forth in claim 9, wherein said plating employs one of a copper sulfate solution from which chloride ions have been removed, a copper pyrophosphate plating solution and an ethylene-diamine copper plating solution.

12. The manufacturing method as set forth in claim 1, wherein said forming said first metal layer further comprises:
   forming on said semiconductor substrate by sputtering a seed metal layer comprising a metal that is the main constituent of said first metal layer and said dissimilar element; and
   forming by plating a plated metal layer comprising said metal that is the main constituent of said first metal layer so as to cover said seed metal layer.

13. The manufacturing method as set forth in claim 12, wherein a thickness of said second metal layer is greater than a total thickness of said plated metal layer and said seed metal layer.

14. The manufacturing method as set forth in claim 1, wherein said first metal layer mainly contains copper.

15. The manufacturing method as set forth in claim 1, wherein said performing heat treatment of said first metal layer and said second metal layer forms a dissimilar element-diffused metal layer.

16. The manufacturing method as set forth in claim 1, wherein said dissimilar element is substantially uniformly diffused throughout said second metal layer.

17. The manufacturing method as set forth in claim 1, wherein said second metal layer comprises a metal that is the main constituent of said first layer and at least one dissimilar element from said metal.

18. The manufacturing method as set forth in claim 1, wherein said at least one dissimilar element comprises at least one of Ag, W, Mg, Be, Zn, Pd, Cd, Au, Hg, Pt, Si, Zr, Ti and Sn.

19. The manufacturing method as set forth in claim 1, wherein said at least one dissimilar element comprises Ag.

20. The manufacturing method as set forth in claim 1, wherein said at least one dissimilar element comprises at least one of Ti and Zr.

21. The manufacturing method as set forth in claim 1, wherein said at least one dissimilar element comprises at least one of Mg, Sn, Zn and Cd.

22. The manufacturing method as set forth in claim 1, wherein said dissimilar element makes up not greater than 5 atomic % of said second metal layer.

23. The manufacturing method as set forth in claim 1, wherein said second metal layer is formed directly on said first metal layer.

24. The manufacturing method as set forth in claim 1, wherein said first metal layer and said second metal fill an entirety of said recess.

25. The manufacturing method as set forth in claim 1, wherein, by said performing heat treatment, said first metal layer and said second layer form a single uniform metal layer.

26. The manufacturing method as set forth in claim 1, wherein said first metal layer comprises a copper-containing layer and said second metal layer comprises copper and at least one dissimilar element different from copper.

27. A manufacturing method of a semiconductor device comprising:
   forming a first metal layer on a semiconductor substrate;
   forming over the first metal layer a second metal layer comprising:
      a metal that is a main constituent of said first metal layer; and
      a dissimilar element different from said metal; and
   performing heat treatment of said first metal layer and said second metal layer to form a dissimilar element-diffused metal layer, a surface whereof has a generally uniform orientation,
   wherein said second metal layer is formed by a bias sputtering method.

28. The manufacturing method as set forth in claim 27, wherein a surface of said dissimilar element-diffused metal layer attains an orientation of (200) through said forming said dissimilar element-diffused metal layer.

29. The manufacturing method as set forth in claim 27, wherein said forming said first metal layer comprises a plating method.

30. The manufacturing method as set forth in claim 27, wherein said forming said first metal layer further comprises:

forming on said semiconductor substrate by sputtering a seed metal layer comprising a metal that is the main constituent of said first metal layer and said dissimilar element; and forming by plating a plated metal layer comprising said metal that is the main constituent of said first metal layer so as to cover said seed metal layer.

31. The manufacturing method as set forth in claim 27, wherein said second metal layer contains a metal that is the main constituent of said first layer and at least one dissimilar element from said metal.

32. A manufacturing method of a semiconductor device comprising:

forming a first metal layer on a substrate;

forming over said first metal layer a second metal layer comprising:

a metal that is a main constituent of said first metal layer; and a dissimilar element different from said metal; and performing heat treatment of said first metal layer and said second metal layer to form a dissimilar element-diffused metal layer, having an average grain size of not less than 1 μm, wherein said second metal layer is formed by a bias sputtering method.

33. The manufacturing method as set forth in claim 32, wherein a surface of said dissimilar element-diffused metal layer attains an orientation of (200) through said forming said dissimilar element-diffused metal layer.

34. The manufacturing method as set forth in claim 32, wherein said forming said first metal layer comprises a plating method.

35. The manufacturing method as set forth in claim 32, wherein said forming said first metal layer further comprises:

forming on said semiconductor substrate by sputtering a seed metal layer comprising a metal that is the main constituent of said first metal layer and said dissimilar element; and forming by plating a plated metal layer comprising said metal that is the main constituent of said first metal layer so as to cover said seed metal layer.

36. The manufacturing method as set forth in claim 32, wherein said second metal layer contains a metal that is the main constituent of said first layer and at least one dissimilar element from said metal.

37. A manufacturing method of a semiconductor device comprising:

forming a dielectric layer on a semiconductor substrate;

forming on said dielectric layer a first interconnect trench and a second interconnect trench narrower than said first interconnect trench;

forming a first metal layer so as to fill a part of an inner portion of said first interconnect trench and an entire inner portion of said second interconnect trench; and forming a second metal layer over said first metal layer so as to also fill a remaining part of said inner portion of said first interconnect trench, wherein said second metal layer comprises a dissimilar element different from a metal that is a main constituent of said first metal layer.

38. The manufacturing method as set forth in claim 37, further comprising performing heat treatment of said first metal layer and said second metal layer.

39. The manufacturing method as set forth in claim 37, wherein a thickness of said second metal layer at a plain portion thereof is made greater than a thickness of said first metal layer at a plain portion thereof.

40. The manufacturing method as set forth in claim 37, wherein said forming said first metal layer comprises a plating method.

41. The manufacturing method as set forth in claim 37, wherein said forming said first metal layer further comprises:

forming on said semiconductor substrate by sputtering a seed metal layer comprising a metal that is the main constituent of said first metal layer and said dissimilar element; and forming by plating a plated metal layer comprising said metal that is the main constituent of said first metal layer so as to cover said seed metal layer.

42. The manufacturing method as set forth in claim 37, wherein said forming said second metal layer comprises a sputtering method.

43. The manufacturing method as set forth in claim 37, wherein said forming said second metal layer comprises a bias sputtering method for applying a bias to said semiconductor substrate.

44. The manufacturing method as set forth in claim 37, wherein said first metal layer mainly contains copper.

45. The manufacturing method as set forth in claim 37, wherein said second metal layer contains a metal that is the main constituent of said first layer and at least one dissimilar element from said metal.

46. The manufacturing method as set forth in claim 37, wherein said second metal layer comprises a metal that is the main constituent of said first layer and at least one dissimilar element from said metal.

* * * * *